US012696384B2

(12) United States Patent
Lee et al.

(10) Patent No.: US 12,696,384 B2
(45) Date of Patent: Jul. 28, 2026

(54) CIRCUIT BOARD

(71) Applicant: LG INNOTEK CO., LTD., Seoul (KR)

(72) Inventors: Dong Keon Lee, Seoul (KR); Seok Jong Youh, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 174 days.

(21) Appl. No.: 18/714,498

(22) PCT Filed: Nov. 29, 2022

(86) PCT No.: PCT/KR2022/019069
§ 371 (c)(1),
(2) Date: May 29, 2024

(87) PCT Pub. No.: WO2023/096458
PCT Pub. Date: Jun. 1, 2023

(65) Prior Publication Data
US 2025/0031303 A1     Jan. 23, 2025

(30) Foreign Application Priority Data
Nov. 29, 2021    (KR) ........................ 10-2021-0167672

(51) Int. Cl.
*H05K 1/11*        (2006.01)
*H05K 1/02*        (2006.01)
*H05K 1/183*       (2026.01)

(52) U.S. Cl.
CPC ............. *H05K 1/0298* (2013.01); *H05K 1/11* (2013.01); *H05K 1/183* (2013.01); *H05K 2201/09409* (2013.01)

(58) Field of Classification Search
CPC ........ H05K 1/0298; H05K 1/11; H05K 1/183; H05K 2201/09409
(Continued)

(56) References Cited

U.S. PATENT DOCUMENTS 10,431,536 B2    10/2019   Kim et al.
10,916,495 B2     2/2021   Choi et al.
(Continued)

FOREIGN PATENT DOCUMENTS

KR    10-2016-0150244 A    12/2016
KR    10-2017-0067472 A     6/2017
(Continued)

*Primary Examiner* — Binh B Tran
(74) *Attorney, Agent, or Firm* — Birch, Stewart, Kolasch & Birch, LLP

(57) ABSTRACT

A circuit board according to an embodiment includes a first insulating layer; a first circuit pattern layer disposed on the first insulating layer; and a second insulating layer disposed on the first circuit pattern layer and having a first cavity, wherein the first circuit pattern layer includes a first pad part vertically overlapping the first cavity; a second pad part that does not vertically overlap the first cavity; and a connection pattern part disposed between the first pad part and the second pad part, and the connection pattern part includes a first portion disposed inside the first cavity and connected to the first pad part, and a second portion disposed outside the first cavity and connected to the second pad part.

18 Claims, 17 Drawing Sheets

(58) Field of Classification Search
     USPC ......................................................... 361/767
     See application file for complete search history.

(56)                    References Cited

U.S. PATENT DOCUMENTS

| 11,373,955 | B2 | 6/2022 | Joo et al. | |
| 11,470,721 | B2 | 10/2022 | Jung | |
| 11,810,864 | B2 | 11/2023 | Joo et al. | |
| 11,979,985 | B2 | 5/2024 | Jung | |
| 12,144,116 | B2 | 11/2024 | Shin et al. | |
| 12,382,582 | B2 | 8/2025 | Jung | |
| 2021/0265274 | A1 | 8/2021 | Joo et al. | |
| 2022/0262713 | A1 | 8/2022 | Na et al. | |
| 2022/0322533 | A1* | 10/2022 | Kim | H05K 1/113 |
| 2022/0328415 | A1 | 10/2022 | Joo et al. | |
| 2024/0146257 | A1* | 5/2024 | Woo | H03F 3/195 |
| 2025/0031312 | A1 | 1/2025 | Shin et al. | |

FOREIGN PATENT DOCUMENTS

| KR | 10-1922884 | B1 | 11/2018 |
| KR | 10-2019-0079065 | A | 7/2019 |
| KR | 10-2020-0015974 | A | 2/2020 |
| KR | 10-2020-0070773 | A | 6/2020 |
| KR | 10-2021-0000105 | A | 1/2021 |
| KR | 10-2021-0046978 | A | 4/2021 |
| KR | 10-2021-0108075 | A | 9/2021 |

* cited by examiner

【FIG. 1】
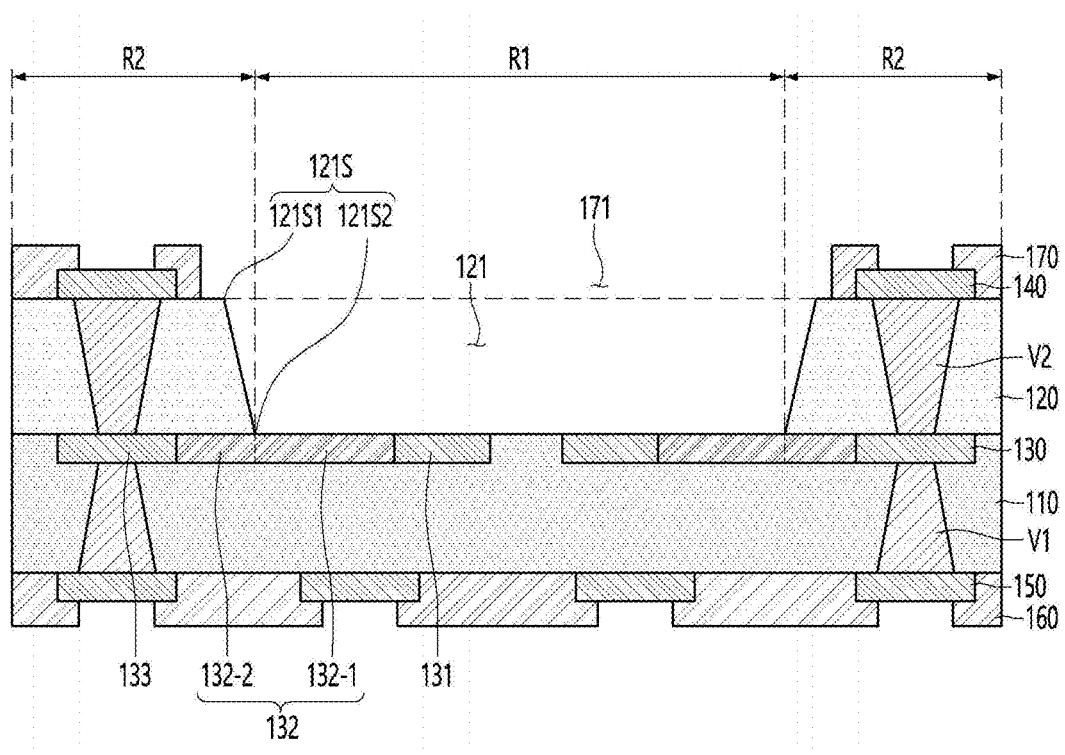

【FIG. 2A】
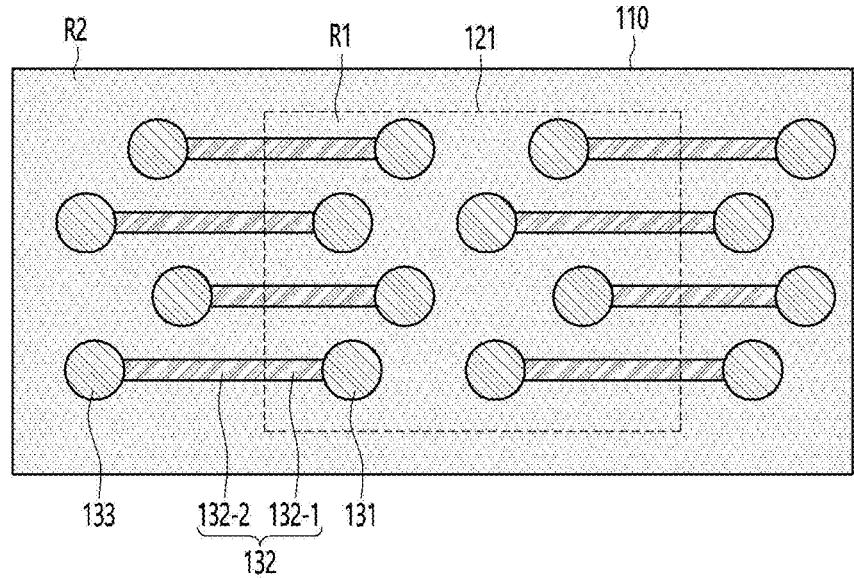
【FIG. 2B】
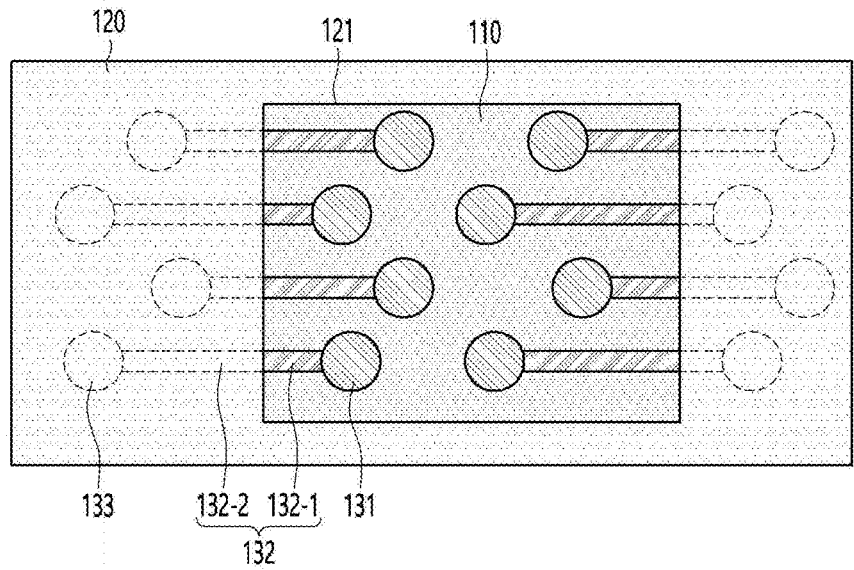

【FIG. 3】
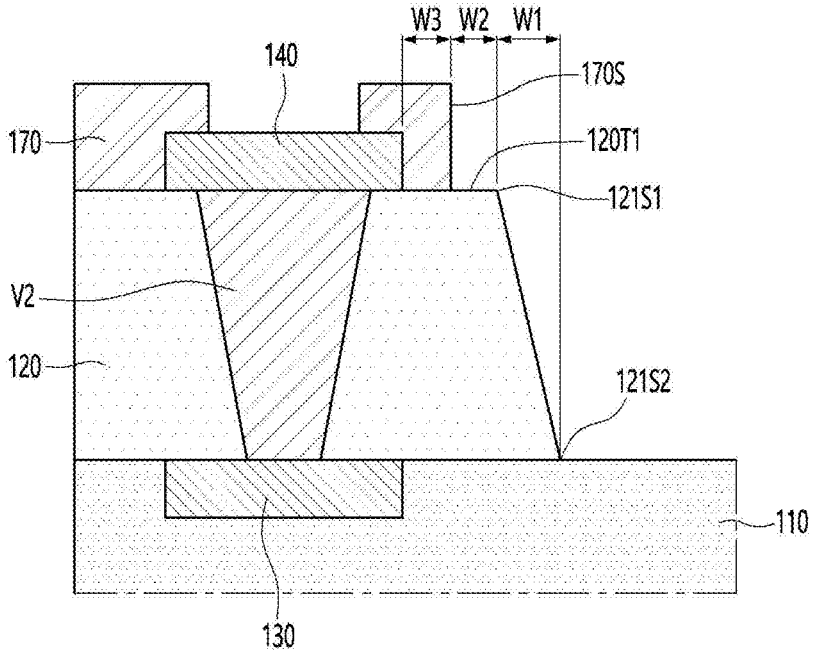
【FIG. 4A】
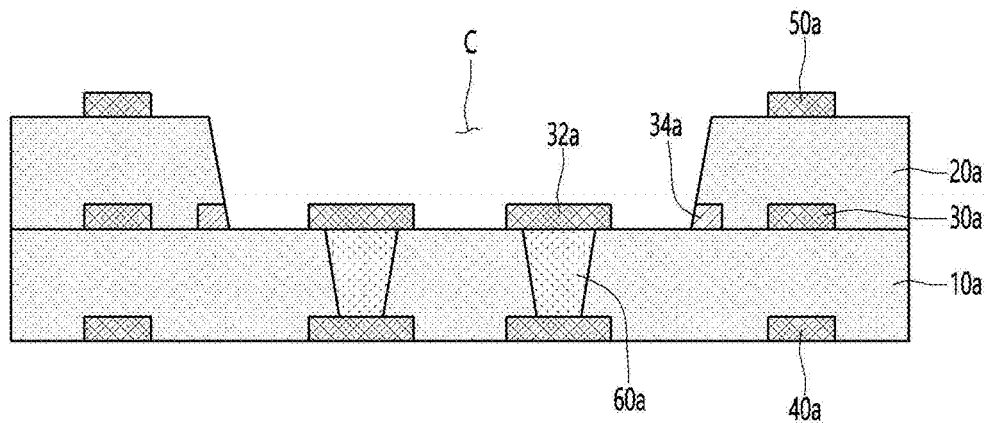

【FIG. 4B】
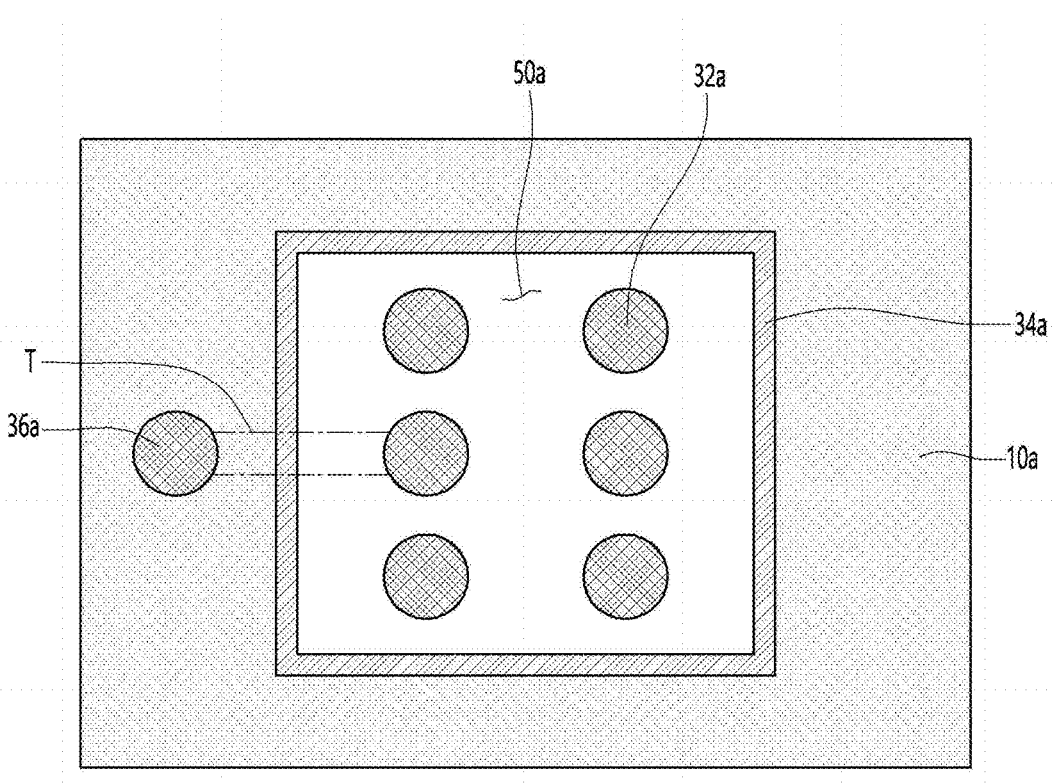
【FIG. 4C】
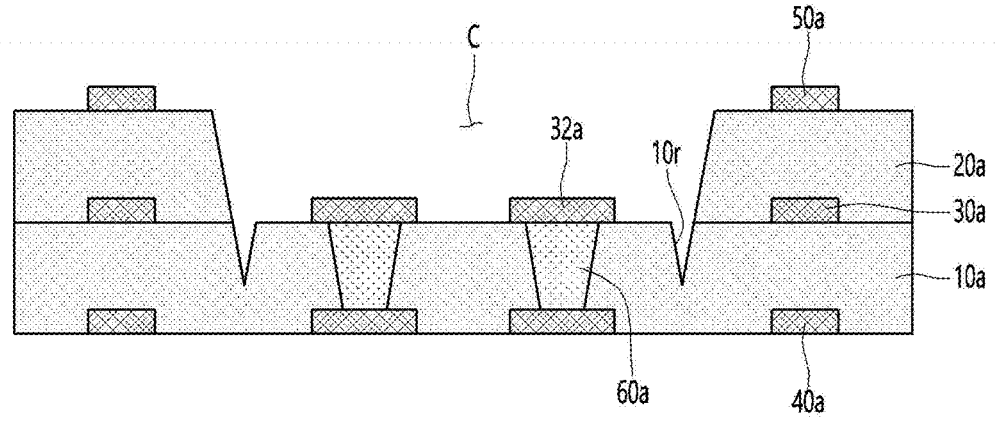

【FIG. 5】
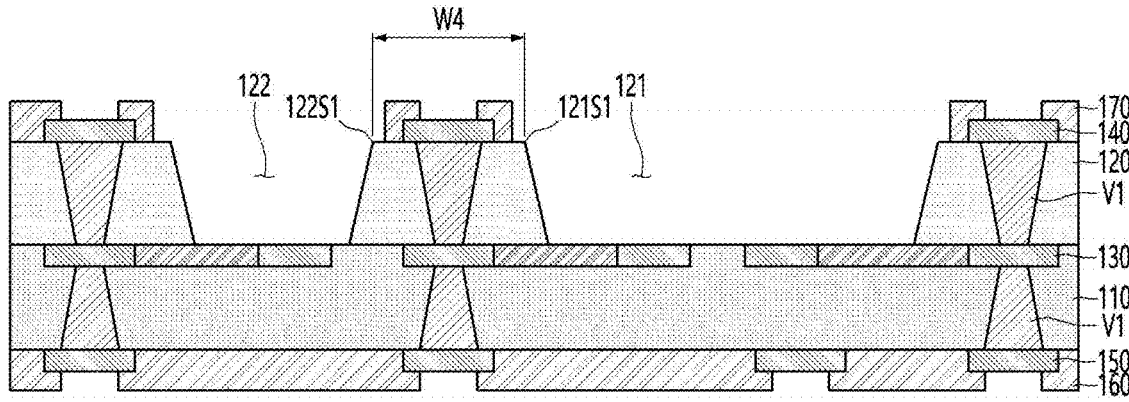
【FIG. 6】
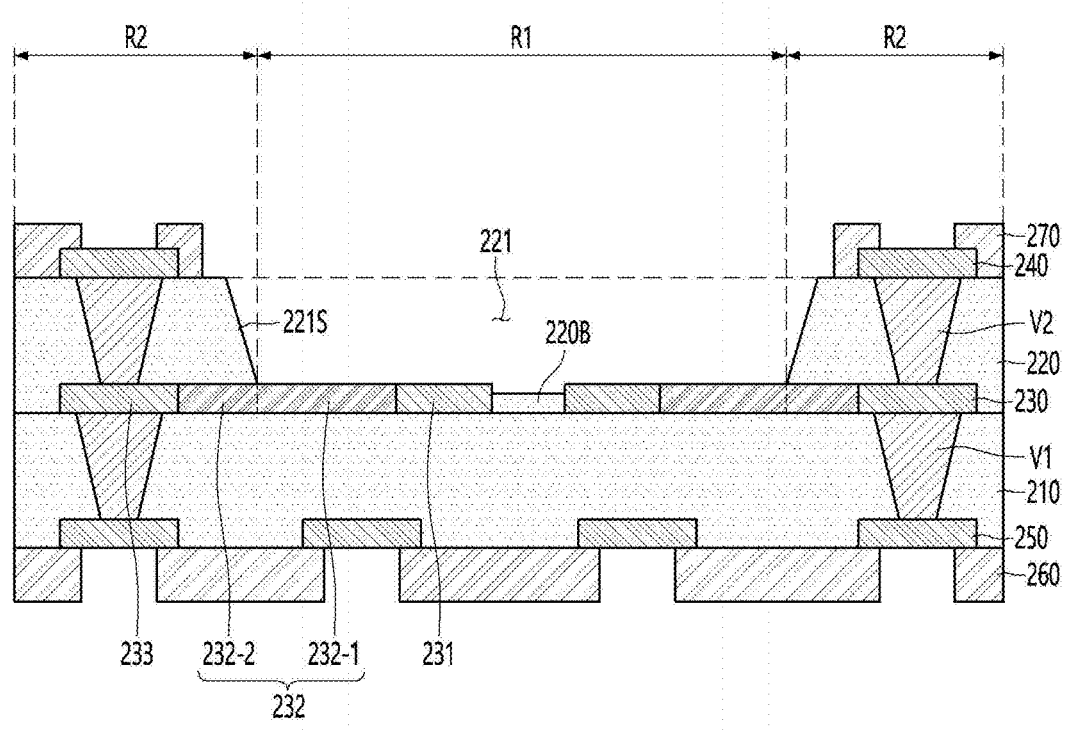

【FIG. 7】
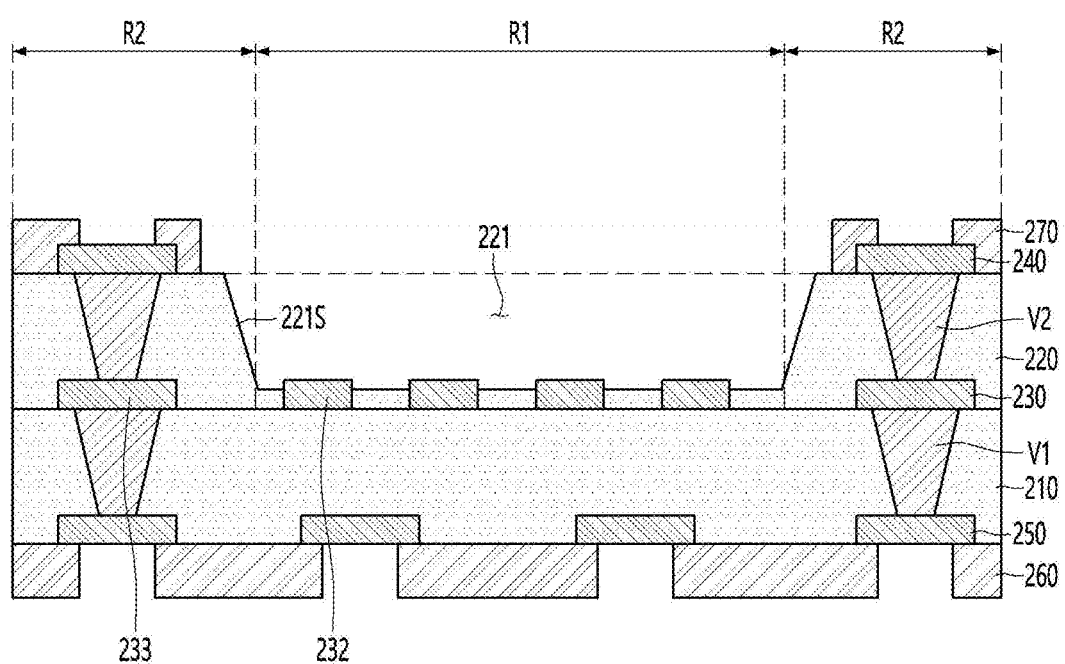

【FIG. 8】
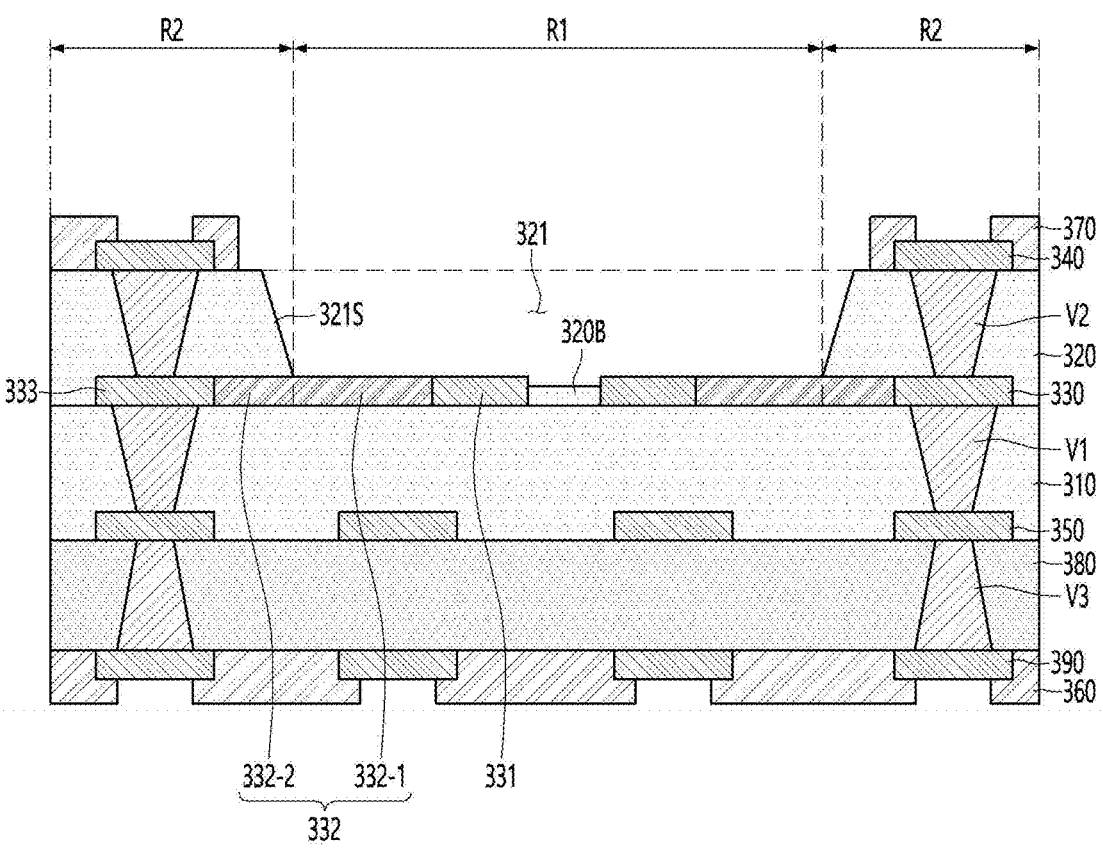

【FIG. 9】
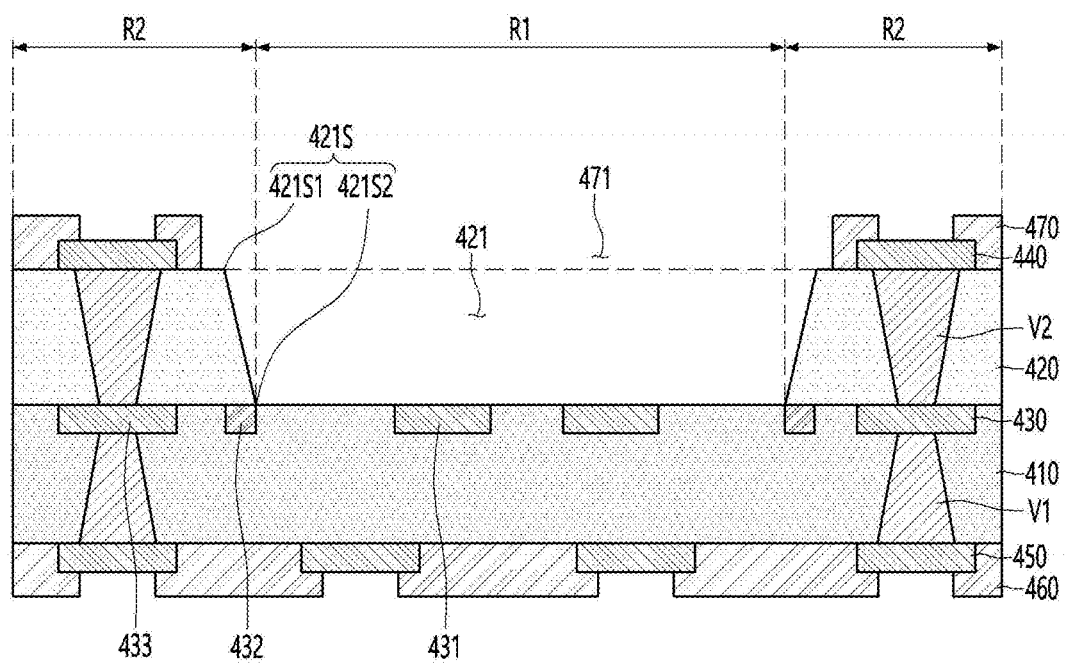
【FIG. 10】
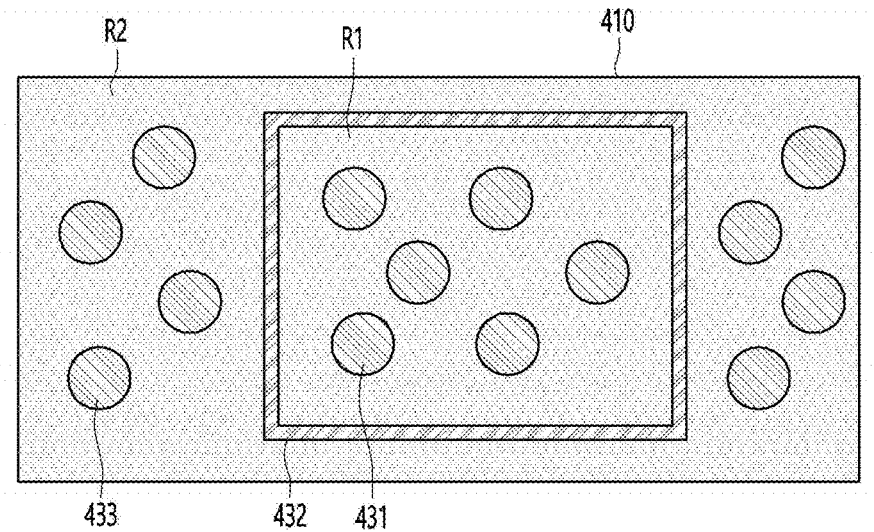

【FIG. 11】
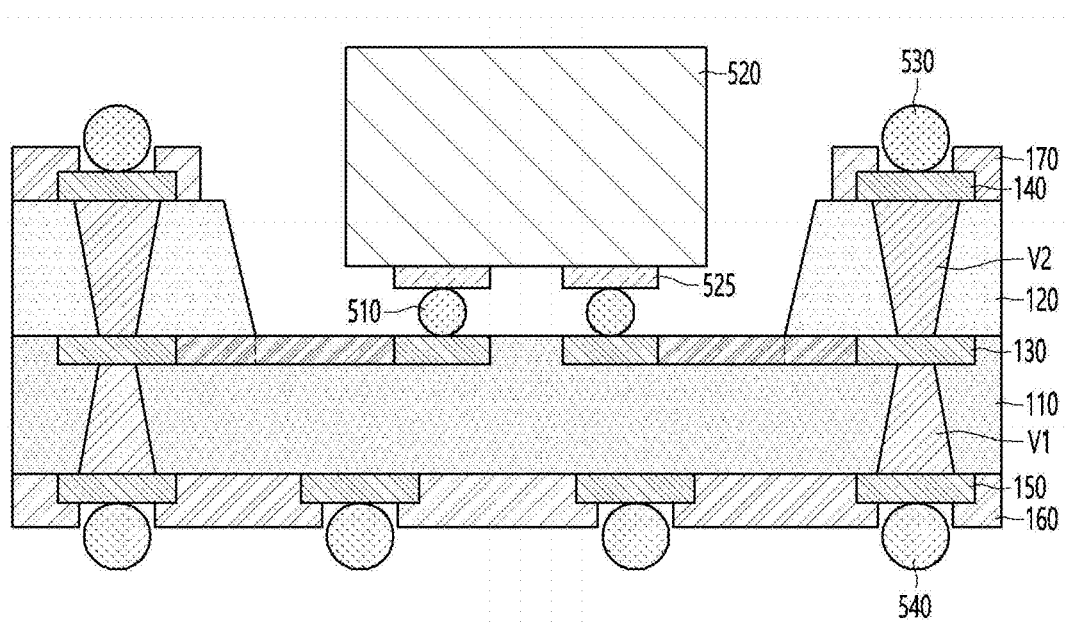

【FIG. 12】
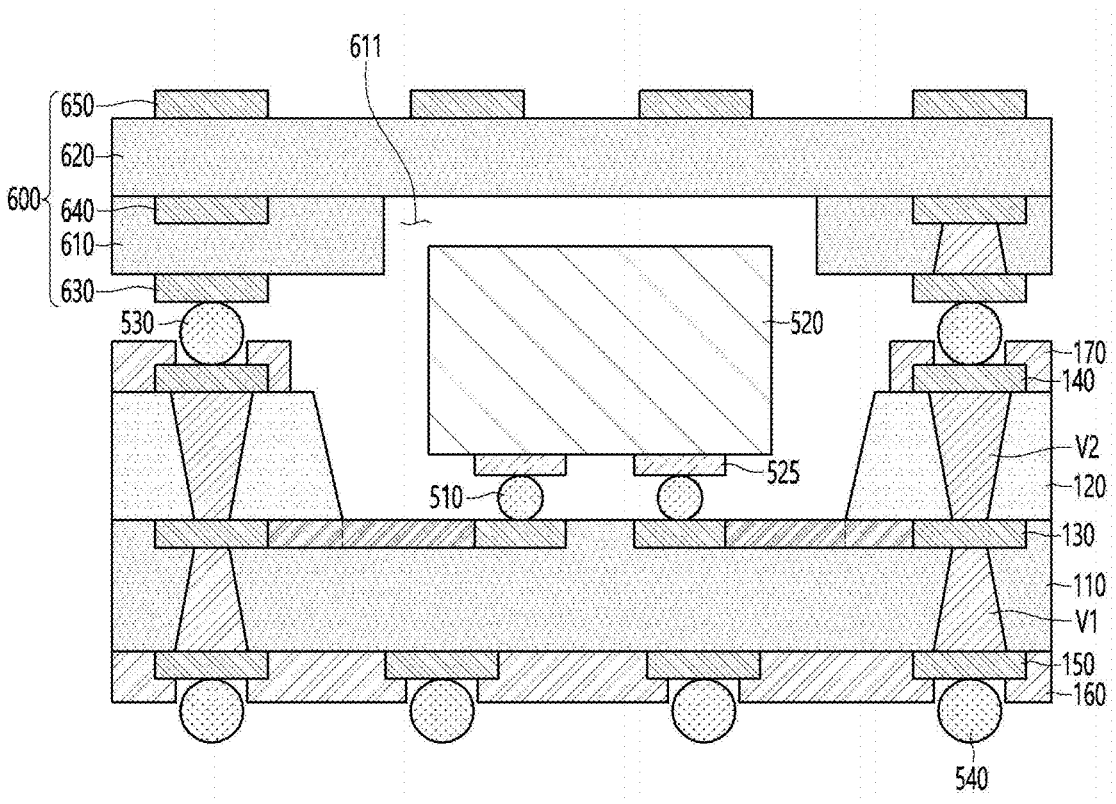

【FIG. 13】
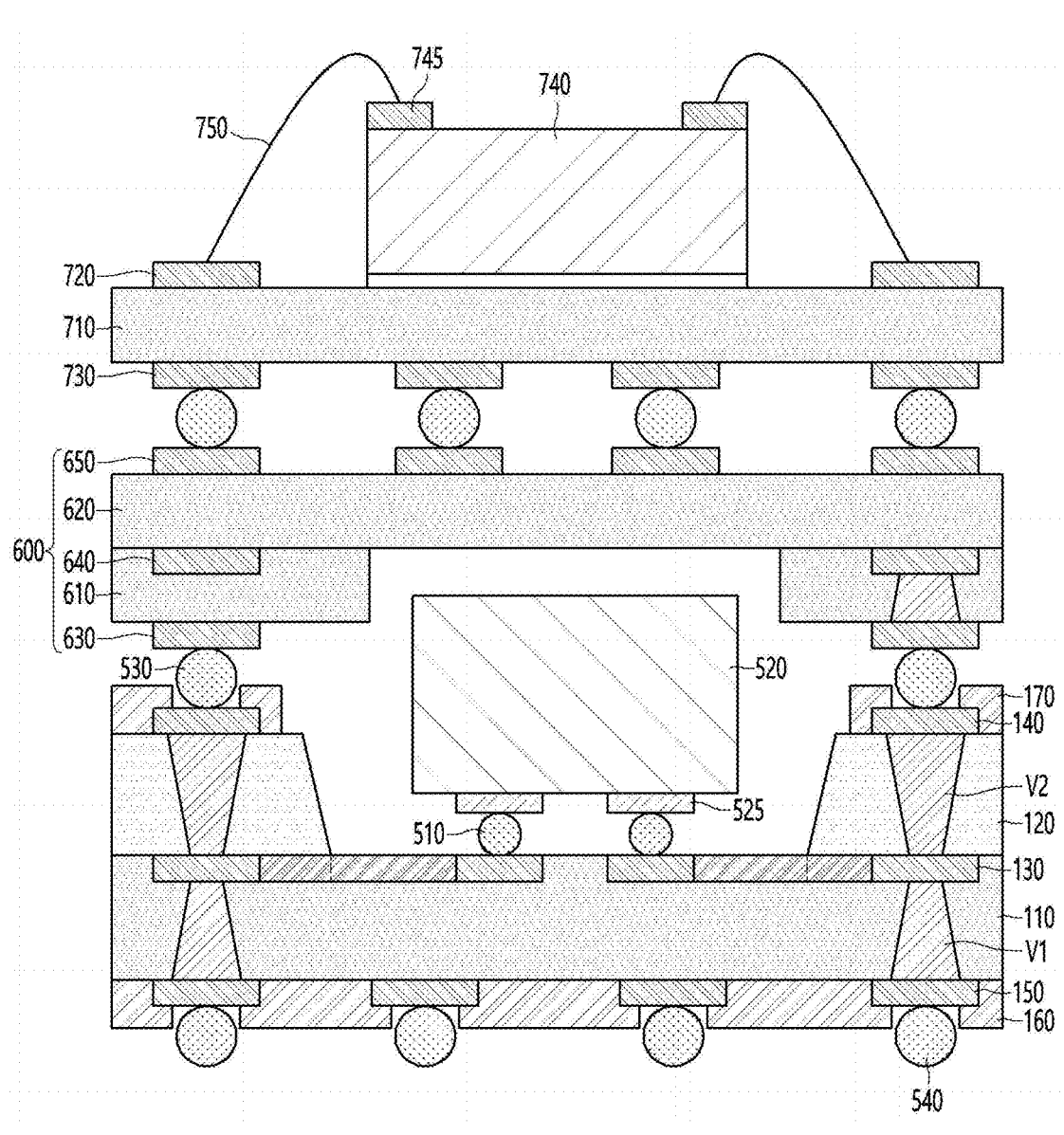

【FIG. 14】
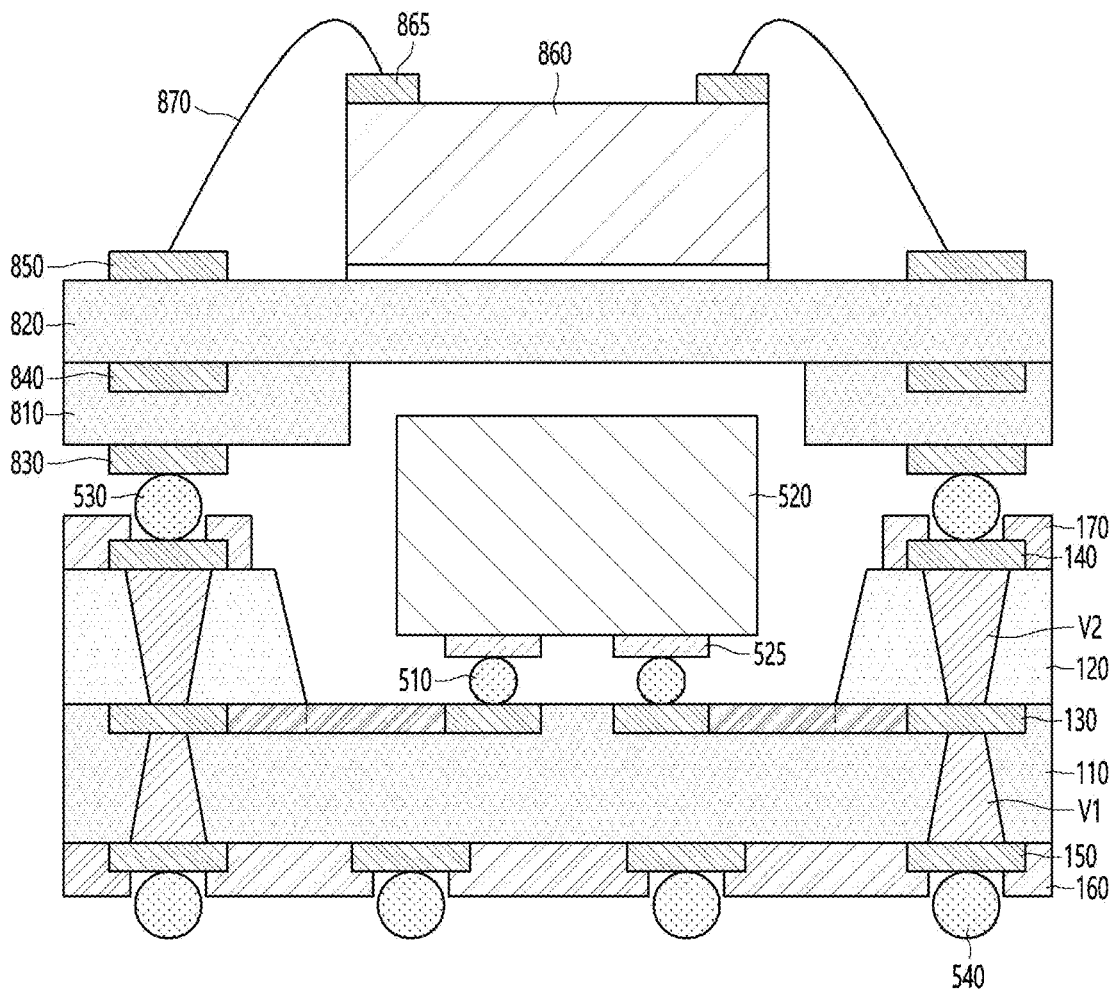
【FIG. 15A】
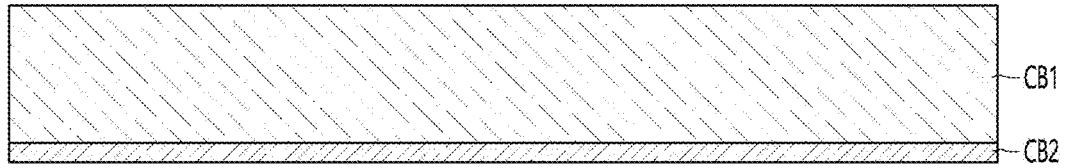

【FIG. 15B】
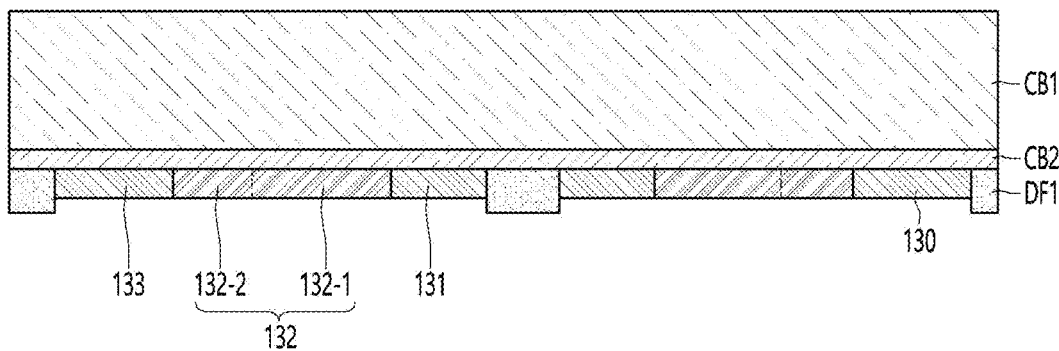
【FIG. 15C】
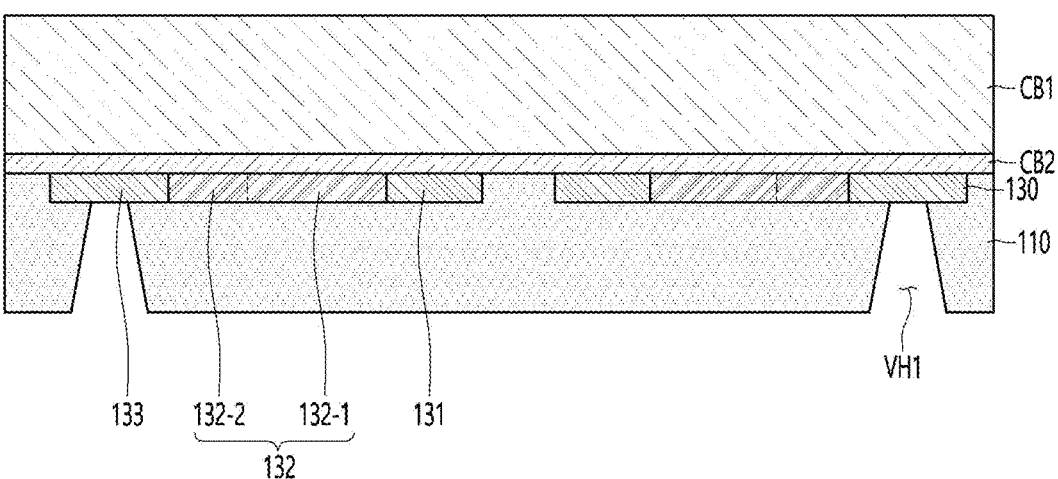

【FIG. 15D】
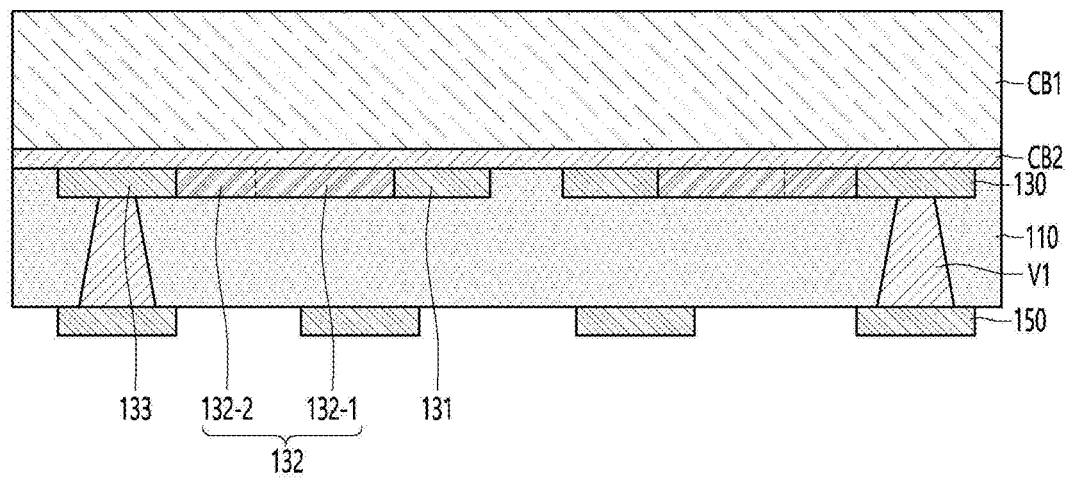
【FIG. 15E】
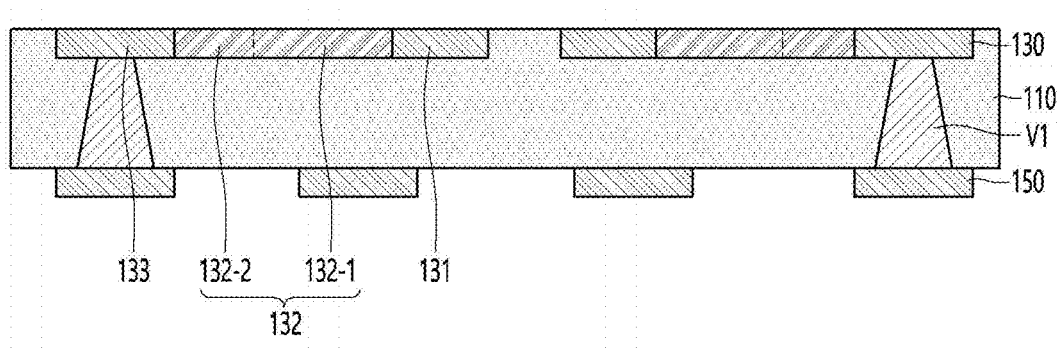

【FIG. 15F】
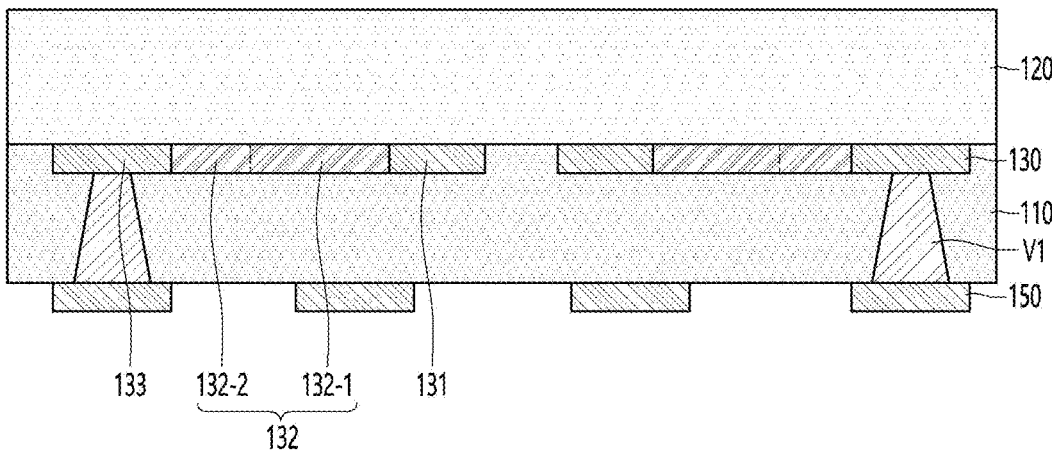
【FIG. 15G】
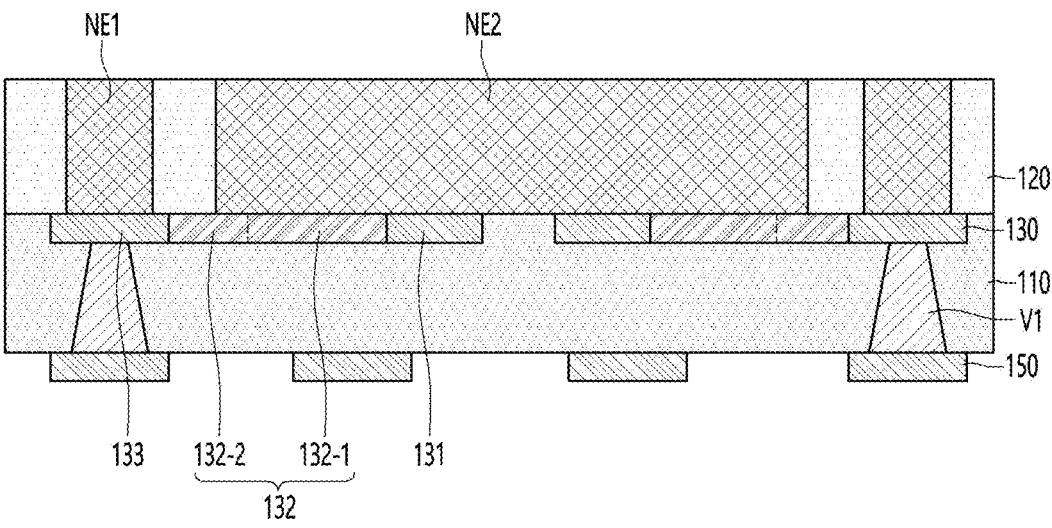

【FIG. 15H】
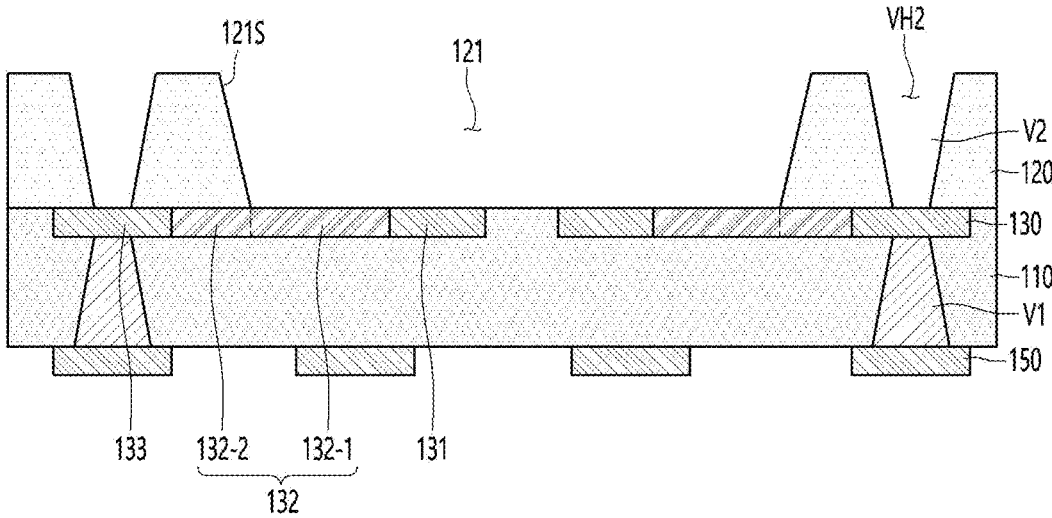
【FIG. 15I】
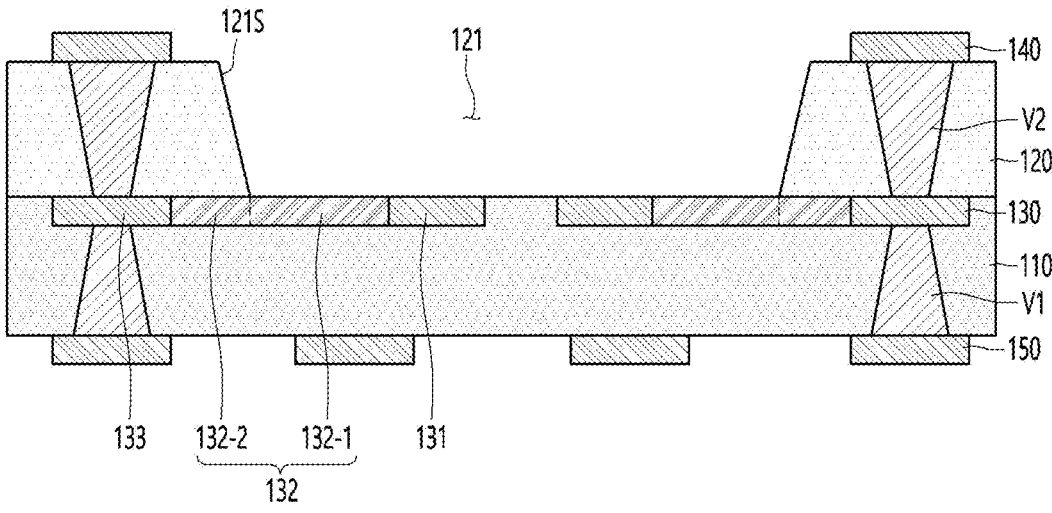

【FIG. 15J】
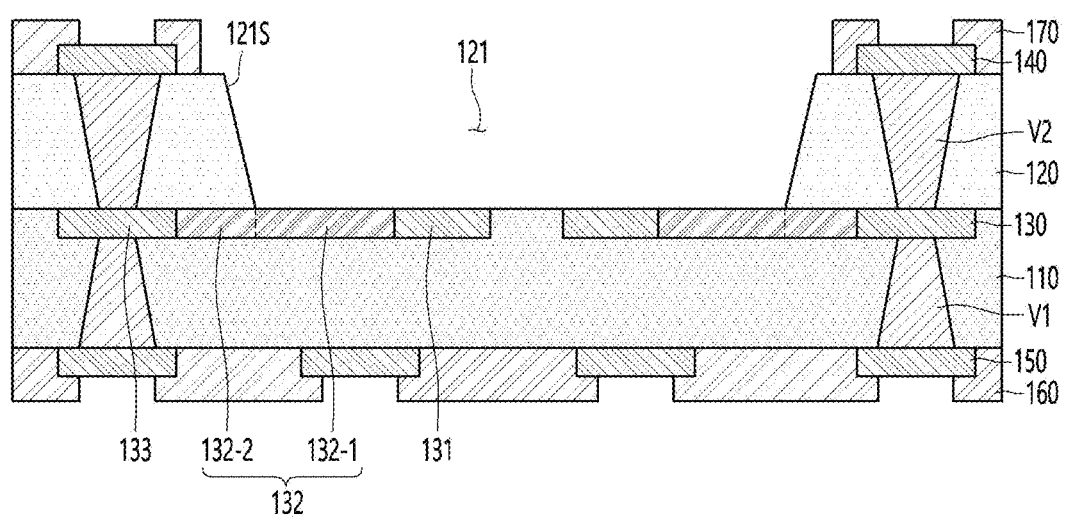

CIRCUIT BOARD

CROSS REFERENCE TO RELATED APPLICATIONS

This application is the National Phase of PCT International Application No. PCT/KR2022/019069, filed on Nov. 29, 2022, which claims priority under 35 U.S.C. 119(a) to Patent Application No. 10-2021-0167672, filed in the Republic of Korea on Nov. 29, 2021, all of which are hereby expressly incorporated by reference into the present application.

TECHNICAL FIELD

The embodiment relates to a circuit board and a semiconductor package substrate including the same.

BACKGROUND ART

As the performance of electric/electronic products progresses, technologies for attaching a larger number of packages to a substrate of a limited size have been proposed and researched. However, since general packages are based on mounting a single semiconductor chip, there is a limit to obtaining desired performance.

A general semiconductor package has a form in which a processor package in which a processor chip is disposed and a memory package to which the memory chip is attached are connected as one. Such a semiconductor package may have a structure in which a processor chip and a memory chip are integrated into one package, thereby reducing a mounting area of the chip and enabling high-speed signal transmission through a short pass.

Due to these advantages, the above semiconductor package is widely applied to mobile devices, etc.

Meanwhile, in recent years, due to the high specification of electronic devices such as mobile devices and the adoption of high bandwidth memories (HBMs), size of the package is increasing, and accordingly, a semiconductor package including an interposer are mainly used. In this case, the interposer is composed of a silicon substrate.

However, in a case of an interposer such as a silicon substrate, the material cost for manufacturing the interposer is high, and forming of TSV (through silicon via) is complex and expensive.

In addition, conventionally, a substrate including a silicon-based interconnect bridge is used as a semiconductor package. However, in the case of a silicon-based interconnect bridge, there is a reliability issue due to a coefficient of thermal expansion (CTE) mismatch between a silicon material of the bridge and an organic material of the substrate, and there is a problem that power integrity characteristics are deteriorated.

DISCLOSURE

Technical Problem

An embodiment provides a circuit board having a new structure and a semiconductor package including the same.

In addition, an embodiment provides a circuit board having a slimmed structure and a semiconductor package including the same.

In addition, an embodiment provides a circuit board including a cavity with optimal physical reliability and electrical reliability, and a semiconductor package including the same.

In addition, an embodiment provides a circuit board capable of minimizing a length of a signal connection line connected to a device and a semiconductor package including the same.

Technical problems to be solved by the proposed embodiments are not limited to the above-mentioned technical problems, and other technical problems not mentioned may be clearly understood by those skilled in the art to which the embodiments proposed from the following descriptions belong.

Technical Solution

A circuit board according to an embodiment comprises a first insulating layer; a first circuit pattern layer disposed on the first insulating layer; and a second insulating layer disposed on the first circuit pattern layer and having a first cavity, wherein the first circuit pattern layer includes a first pad part vertically overlapping the first cavity; a second pad part that does not vertically overlap the first cavity; and a connection pattern part disposed between the first pad part and the second pad part, and wherein the connection pattern part includes a first portion disposed inside the first cavity and connected to the first pad part, and a second portion disposed outside the first cavity and connected to the second pad part.

In addition, an upper surface of the first portion of the connection pattern part does not contact the second insulating layer while vertically overlapping the first cavity, and an upper surface of the second portion of the connection pattern part contacts the second insulating layer without vertically overlapping the first cavity.

In addition, the connection pattern part, the first pad part, and the second pad part overlap each other in a horizontal direction.

In addition, a width of the connection pattern part is smaller than a width of each of the first and second pad parts.

In addition, the connection pattern part has a first planar shape, and each of the first pad part and the second pad part has a second planar shape different from the first planar shape.

In addition, the second insulating layer includes a first inclined surface of the first cavity whose width decreases toward the first insulating layer, the first inclined surface includes a first end portion positioned adjacent to an upper surface of the second insulating layer at one side of the first cavity, and a second end portion positioned adjacent to a lower surface of the second insulating layer at the one side of the first cavity, and a horizontal distance between the first end portion and the second end portion satisfies a range of 0.1 μm to 25 μm.

In addition, the circuit board further comprises a protective layer disposed on the second insulating layer and including a through hole vertically overlapping the first cavity.

In addition, a width of the through hole of the protective layer is greater than a width of a region adjacent to an upper surface of the second insulating layer among an entire region of the first cavity.

In addition, the second insulating layer includes a first upper surface adjacent to the first end portion of the first inclined surface and vertically overlapping the through hole of the protective layer, and a width of the first upper surface is a horizontal distance between the first end portion and an inner wall of the through hole of the protective layer adjacent to the first end portion, and satisfies a range of 50 μm to 80 μm.

In addition, the circuit board further comprises a second circuit pattern layer disposed on the second insulating layer, and a pattern of the second circuit pattern layer disposed closest to the first end portion is spaced apart from an inner wall of the through hole of the protective layer by a spacing in a range of 55 μm to 95 μm.

In addition, the second insulating layer includes a second cavity spaced apart from the first cavity in a horizontal direction and including a second inclined surface of the second cavity whose width decreases toward the first insulating layer, and the second inclined surface includes a third end portion adjacent to the upper surface of the second insulating layer and the first end portion of the first inclined surface, and a spacing between the first end portion and the third end portion satisfies a range of 100 μm to 150 μm.

In addition, the first insulating layer includes a prepreg, and the second insulating layer includes photo imageable dielectrics (PID).

In addition, the first insulating layer includes a prepreg, and the second insulating layer includes an ABF (Ajinomoto build-up film) or a resin coated copper (RCC).

In addition, at least a portion of the second portion of the connection pattern part overlaps vertically with the first inclined surface of the first cavity.

In addition, the first insulating layer and the second insulating layer include the same first insulating material, the first insulating material includes Photo imageable dielectrics (PID), and a lower surface of the first cavity is located higher than a lower surface of the first circuit pattern layer and lower than an upper surface of the first circuit pattern layer.

In addition, the circuit board further comprises a third insulating layer disposed under the second insulating layer, the third insulating layer includes a second insulating material different from that of the first and second insulating layers, and the second insulating material includes a prepreg.

Meanwhile, a semiconductor package according to an embodiment comprises a first circuit board including a first cavity; and a second circuit board including a second cavity vertically overlapping the first cavity and coupled to the first circuit board, wherein the first circuit board comprises a first insulating layer; a first circuit pattern layer disposed on the first insulating layer; a second insulating layer disposed on the first insulating layer and the first circuit pattern layer and including the first cavity; and a second circuit pattern layer disposed on the second insulating layer; a first conductive coupling part disposed on the first circuit pattern layer vertically overlapping the first cavity; a processor chip disposed on the first conductive coupling part; and a second conductive coupling part disposed on the second circuit pattern layer and coupled to the second circuit board, wherein the second insulating layer includes a first inclined surface of the first cavity whose width decreases toward the first insulating layer, the first inclined surface includes a first end portion adjacent to an upper surface of the second insulating layer at one side of the first cavity, and a second end portion adjacent to a lower surface of the second insulating layer on the one side of the first cavity, and a horizontal distance between the first end portion and the second end portion satisfies a range of 0.1 μm to 25 μm.

In addition, the first circuit board further comprises a protective layer disposed on the second insulating layer and including a through hole vertically overlapping the first cavity, and a width of the through hole of the protective layer is greater than a width of a region adjacent to an upper surface of the second insulating layer among an entire region of the first cavity, the second insulating layer includes a first upper surface adjacent to the first end portion of the first inclined surface and vertically overlapping a through hole of the protective layer, and a width of the first upper surface is a horizontal distance between the first end portion and an inner wall of the through hole of the protective layer adjacent to the first end portion, and satisfies a range of 50 μm to 80 μm.

In addition, a pattern disposed closest to the first end portion among the second circuit pattern layers is spaced apart from the first end portion by a spacing of 55 μm to 95 μm.

In addition, at least a portion of the processor chip is disposed within the second cavity, and an uppermost end of the processor chip is positioned higher than an uppermost end of the second conductive coupling part.

In addition, the semiconductor package includes a third circuit board disposed on the second circuit board, the third circuit board includes a memory chip, and the second circuit board is an interposer substrate connecting the first circuit board and the third circuit board.

In addition, the semiconductor package includes a memory chip mounted on the second circuit board, and the second circuit board is a memory substrate connected to the first circuit board.

In addition, the first cavity includes a first-first cavity and a first-second cavity spaced in a longitudinal direction or a width direction, the processor chip includes a first processor chip disposed in the first-first cavity and a second processor chip disposed in the first-second cavity, and the first-first cavity and the first-second cavity are spaced apart by a spacing in a range of 100 μm to 150 μm.

Advantageous Effects

The embodiment includes a first insulating layer and a second insulating layer. At this time, the second insulating layer includes a cavity. At this time, the embodiment manages a width between a first end portion and a second end portion of an inclined surface of the second insulating layer including the cavity. In addition, the embodiment includes a protective layer disposed on the second insulating layer and including a through hole vertically overlapping the cavity. In addition, the embodiment manages a width of a region of an upper surface of the second insulating layer vertically overlapping the through hole of the protective layer. In addition, the embodiment manages a spacing between an adjacent pattern disposed closest to the through hole among the second circuit pattern layers disposed on the second insulating layer and a side surface of the protective layer. Accordingly, the embodiment may improve the physical reliability and electrical reliability of the circuit board, thereby improving the circuit integration, and thereby slimming the size of the circuit board.

Meanwhile, the second insulating layer includes a photosensitive material. Accordingly, the cavity may be formed in the second insulating layer by performing a photolithography process. In this case, in an embodiment, the cavity may be selectively formed only in the second insulating layer within a range in which the first insulating layer is not damaged without a stop layer. In this case, a first circuit pattern layer is disposed between the first insulating layer and the second insulating layer. The first circuit pattern layer includes a first pad part vertically overlapping the cavity and a second pad part not vertically overlapping the cavity. In addition, the first circuit pattern layer includes a connection pattern part directly connecting the first pad part and the second pad part. The connection pattern part may mean a trace of the first circuit pattern layer. One end of the connection pattern part may be directly connected to the first pad part. In addition, the other end of the connection pattern part may be directly connected to the second pad part.

Accordingly, the embodiment may have a structure in which the first pad part and the second pad part are directly connected to each other through the connection pattern part, and accordingly, signal transmission characteristics or operation reliability may be improved.

For example, in a comparative example, a stop layer is required to form a cavity, and accordingly, it was impossible to form the above-described connection pattern part. Accordingly, in the comparative example, at least two through electrodes are required to connect the first pad part and the second pad part. For example, the comparative example includes a first through electrode vertically overlapping the first pad part and a second through electrode vertically overlapping the second pad part, and accordingly, the first pad part and the second pad part are connected to each other. Accordingly, in order to connect the first pad part and the second pad part, the comparative example further includes a signal path including the first through electrode and the second through electrode compared to the embodiment, and accordingly, there is a problem that a signal line between the first pad part and the second pad part increases.

In contrast, the embodiment may directly connect the first pad part 131 and the second pad part using the connection pattern part. Accordingly, the embodiment may minimize a signal transmission distance between the first pad part and the second pad part. Accordingly, the embodiment does not require a separate through electrode for connecting the first pad part and the second pad part, and accordingly, an additional circuit pattern layer may be disposed in a space corresponding to the through electrode, thereby improving circuit integration.

In addition, in an embodiment, a signal transmission distance between the first pad part and the second pad part corresponds to a length of the connection pattern part. Accordingly, an embodiment may reduce a distance corresponding to a path including at least two through electrodes in the signal transmission distance compared to a comparative example, and thus, a signal transmission distance between the first pad part and the second pad part may be minimized. In addition, in an embodiment, as a signal transmission distance between the first pad part and the second pad part is reduced, an effect of noise increasing in proportion to the signal transmission distance may be minimized. Accordingly, the embodiment may improve signal transmission characteristics between the first pad part and the second pad part, and further improve operation reliability of the circuit board.

DESCRIPTION OF DRAWINGS

FIG. 1 is a cross-sectional view illustrating a circuit board according to a first embodiment.

FIG. 2A is a top view of the circuit board of FIG. 1 with some components removed.

FIG. 2B is a plan view showing a first circuit pattern layer in a state in which a second insulating layer is disposed in FIG. 2A.

FIG. 3 is an enlarged view of a cavity region of the circuit board of FIG. 1.

FIG. 4A is a cross-sectional view of a circuit board including a cavity of a first comparative example.

FIG. 4B is a plan view of the circuit board of FIG. 4A.

FIG. 4C is a cross-sectional view of a circuit board including a cavity of a second comparative example.

FIG. 5 is a view illustrating a circuit board according to a second embodiment.

FIG. 6 is a view illustrating a circuit board according to a third embodiment.

FIG. 7 is a cross-sectional view taken along a direction A-A' of FIG. 2B with respect to the circuit board of a third embodiment.

FIG. 8 is a view illustrating a circuit board according to a fourth embodiment.

FIG. 9 is a view illustrating a circuit board according to a fifth embodiment.

FIG. 10 is a plan view of a state in which some layers are removed from the circuit board of FIG. 9.

FIG. 11 is a view illustrating a first semiconductor package according to an embodiment.

FIG. 12 is a view illustrating a second semiconductor package according to an embodiment.

FIG. 13 is a view illustrating a third semiconductor package according to an embodiment.

FIG. 14 is a view illustrating a fourth semiconductor package according to an embodiment.

FIGS. 15A to 15J are view showing a method of manufacturing a circuit board shown in FIG. 2 in order of processes.

MODES OF THE INVENTION

Hereinafter, embodiments of the present invention will be described in detail with reference to the accompanying drawings.

However, the spirit and scope of the embodiment is not limited to a part of the embodiments described, and may be implemented in various other forms, and within the spirit and scope of the present invention, one or more of the elements of the embodiments may be selectively combined and replaced.

In addition, unless expressly otherwise defined and described, the terms used in the embodiments of the present invention (including technical and scientific terms may be construed the same meaning as commonly understood by one of ordinary skill in the art to which this invention belongs, and the terms such as those defined in commonly used dictionaries may be interpreted as having a meaning that is consistent with their meaning in the context of the relevant art.

In addition, the terms used in the embodiments of the present invention are for describing the embodiments and are not intended to limit the present invention. In this specification, the singular forms may also include the plural forms unless specifically stated in the phrase, and may include at least one of all combinations that may be combined in A, B, and C when described in "at least one (or more) of A (and), B, and C".

Further, in describing the elements of the embodiments of the present invention, the terms such as first, second, A, B, (a), and (b) may be used. These terms are only used to distinguish the elements from other elements, and the terms are not limited to the essence, order, or order of the elements. In addition, when an element is described as being "connected", or "coupled" to another element, it may include not only when the element is directly "connected" to, or "coupled" to other elements, but also when the element is "connected", or "coupled" by another element between the element and other elements.

Further, when described as being formed or disposed "on (over)" or "under (below)" of each element, the "on (over)" or "under (below)" may include not only when two elements are directly connected to each other, but also when one or more other elements are formed or disposed between two elements. Furthermore, when expressed as "on (over)" or "under (below)", it may include not only the upper direction but also the lower direction based on one element.

Electronic Device

Before describing the embodiment, an electronic device including the semiconductor package of the embodiment will be briefly described. An electronic device includes a main board (not shown). The main board may be physically and/or electrically connected to various components. For example, the main board may be connected to a semiconductor package of the embodiment. Various semiconductor devices may be mounted on the semiconductor package. The semiconductor package may include memory chips such as volatile memory (e.g., DRAM), non-volatile memory (e.g., ROM), and flash memory, application processor chips such as central processors (e.g., CPUs), graphics processors (e.g., GPUs), digital signal processors, encryption processors, microprocessors, and microcontrollers, and logic chips such as analog-to-digital converters and application-specific ICs (ASICs).

Furthermore, the embodiment provides a semiconductor package capable of mounting at least two chips of different types on one substrate while reducing a thickness of the semiconductor package connected to the main board of the electronic device.

The electronic device may be a smart phone, a personal digital assistant, a digital video camera, a digital still camera, a vehicle, a high-performance server, a network system, computer, monitor, tablet, laptop, netbook, television, video game, smart watch, automotive, or the like. However, the embodiment is not limited thereto, and may be any other electronic device that processes data in addition to these.

Embodiment

Hereinafter, a circuit board and a semiconductor package including the circuit board according to an embodiment will be described in detail.

FIG. 1 is a cross-sectional view illustrating a circuit board according to a first embodiment, FIG. 2A is a top view of the circuit board of FIG. 1 with some components removed, FIG. 2B is a plan view showing a first circuit pattern layer in a state in which a second insulating layer is disposed in FIG. 2A, FIG. 3 is an enlarged view of a cavity region of the circuit board of FIG. 1, FIG. 4A is a cross-sectional view of a circuit board including a cavity of a first comparative example, FIG. 4B is a plan view of the circuit board of FIG. 4A, and FIG. 4C is a cross-sectional view of a circuit board including a cavity of a second comparative example.

Hereinafter, a circuit board including a cavity according to an embodiment will be described in detail with reference to FIGS. 1 to 4C.

The circuit board of the embodiment includes a plurality of insulating layers. Here, each of the plurality of insulating layers may have a single layer structure, and differently, may be have a structure including a plurality of layers.

Specifically, the circuit board includes a first insulating layer 110 and a second insulating layer 120.

As illustrated in FIG. 2, the first insulating layer 110 may have a single layer structure, and differently, may have a structure including a plurality of layers.

In addition, the second insulating layer 120 is disposed on the first insulating layer 110. The second insulating layer 120 may have a single layer structure, and differently, may have a structure including a plurality of layers.

In the first embodiment, the first insulating layer 110 and the second insulating layer 120 may include different insulating materials.

For example, the first insulating layer 110 may include a first insulating material, and the second insulating layer 120 may include a second insulating material different from that of the first insulating layer 110.

For example, the first insulating material constituting the first insulating layer 110 may include a prepreg (PPG). The prepreg may be formed by impregnating a fiber layer in the form of a fabric sheet, such as a glass fabric woven with glass yarn, with an epoxy resin, and then performing thermocompression. However, the embodiment is not limited to this, and the prepreg constituting the first insulating layer 110 may include a fiber layer in the form of a fabric sheet woven with carbon fiber yarn.

The first insulating layer 110 may include a resin and a reinforcing fiber disposed in the resin. The resin may be an epoxy resin, but is not limited thereto. The resin is not particularly limited to the epoxy resin, and for example, one or more epoxy groups may be included in the molecule, or alternatively, two or more epoxy groups may be included, or alternatively, four or more epoxy groups may be included. In addition, the resin of the first insulating layer 110 may include a naphthalene group, for example, may be an aromatic amine type, but is not limited thereto. For example, the resin may be include a bisphenol A type epoxy resin, a bisphenol F type epoxy resin, a bisphenol S type epoxy resin, a phenol novolac type epoxy resin, an alkylphenol novolac type epoxy resin, a biphenyl type epoxy resin, an aralkyl type epoxy resin, dicyclopentadiene type epoxy resin, naphthalene type epoxy resin, naphthol type epoxy resin, epoxy resin of condensate of phenol and aromatic aldehyde having phenolic hydroxyl group, biphenyl aralkyl type epoxy resin, fluorene type epoxy resin resins, xanthene-type epoxy resins, triglycidyl isocyanurate, rubber-modified epoxy resins, phosphorous-based epoxy resins, and the like, and naphthalene-based epoxy resins, bisphenol A-type epoxy resins, and phenol novolac epoxy resins, cresol novolak epoxy resins, rubber-modified epoxy resins, and phosphorous-based epoxy resins. In addition, the reinforcing fiber may include glass fiber, carbon fiber, aramid fiber (e.g., aramid-based organic material), nylon, silica-based inorganic material or titania-based inorganic material. The reinforcing fibers may be arranged in the resin to cross each other in a planar direction.

Meanwhile, the embodiment may use as the glass fiber, carbon fiber, aramid fiber (e.g., aramid-based organic material), nylon, silica-based inorganic material or titania-based inorganic material.

The second insulating material constituting the second insulating layer 120 is different from the first insulating material. For example, the second insulating layer 120 may include a photosensitive material. For example, the second insulating material constituting the second insulating layer 120 may include a photo imaginable dielectric (PID). However, the embodiment is not limited thereto, and the second insulating material constituting the second insulating layer 120 may be any photosensitive material capable of forming a through hole (not shown) for forming a through electrode or a cavity for mounting a device through a photolithography process.

Each of the first insulating layer 110 and the second insulating layer 120 may have a thickness in a range of 10 μm to 60 μm. For example, each of the first insulating layer 110 and the second insulating layer 120 may have a thickness in a range of 15 μm to 55 μm. For example, each of the first insulating layer 110 and the second insulating layer 120 may have a thickness in a range of 20 μm to 50 μm. If the thicknesses of the first insulating layer 110 and the second insulating layer 120 are less than 10 μm, the circuit pattern layer included in the circuit board may not be stably protected. If each thickness of the first insulating layer 110 and the second insulating layer 120 exceeds 60 μm, an overall thickness of the circuit board may increase. In addition, if each thickness of the first insulating layer 110 and the second insulating layer 120 exceeds 60 μm, a thickness of the circuit pattern layer or the through electrode correspondingly increases, and thus, a loss of a signal transmitted through the circuit pattern may increase.

In this case, the thicknesses of the first insulating layer 110 and the second insulating layer 120 may correspond to a distance in a thickness direction between circuit pattern layers disposed on different layers.

For example, the thickness of the first insulating layer 110 may mean a vertical distance between a lower surface of the first circuit pattern layer 130 and an upper surface of the third circuit pattern layer 150. For example, the thickness of the second insulating layer 120 may mean a vertical linear distance in the thickness direction between an upper surface of the first circuit pattern layer 130 and a lower surface of the second circuit pattern layer 140.

The first insulating layer 110 may mean an uppermost insulating layer disposed adjacent to an uppermost side of the circuit board. In addition, the second insulating layer 120 may mean a lowermost insulating layer disposed adjacent to a lowermost side of the circuit board.

A circuit pattern layer is disposed on surfaces of the first insulating layer 110 and the second insulating layer 120.

For example, a first circuit pattern layer 130 may be disposed between an upper surface of the first insulating layer 110 and a lower surface of the second insulating layer 120. For example, a second circuit pattern layer 140 may be disposed on an upper surface of the second insulating layer 120. For example, a third circuit pattern layer 150 may be disposed on a lower surface of the first insulating layer 110.

The first circuit pattern layer 130 may be disposed in the first insulating layer 110. For example, at least a portion of the first circuit pattern layer 130 may be disposed in the first insulating layer 110. For example, at least a portion of a side surface of the first circuit pattern layer 130 may be covered with the first insulating layer 110.

The second circuit pattern layer 140 may protrude above the upper surface of the second insulating layer 120. The second circuit pattern layer 140 may mean an uppermost circuit pattern layer disposed at an uppermost side of the circuit board.

The third circuit pattern layer 150 may protrude below a lower surface of the first insulating layer 110. The third circuit pattern layer 150 may mean a lowermost circuit pattern layer disposed at a lowermost side of the circuit board.

The first circuit pattern layer 130, the second circuit pattern layer 140, and the third circuit pattern layer 150 may each include a pad and a trace according to a function. The pad may be a mounting pad on which a device or a chip is mounted, or a terminal pad connected to an external substrate. The trace may be a long signal line connecting a plurality of pads. The trace is a fine pattern having a width smaller than a width of the pad. For example, in an embodiment, a spacing between a plurality of traces may have a range of 2 μm to 15 μm, and a line width of each trace may have a range of 2 μm to 15 μm. Furthermore, a pad of the first circuit pattern layer 130 may correspond to the first and second pattern parts to be described below. Furthermore, a trace of the first circuit pattern layer 130 may refer to a connection pattern part to be described below. This will be described in more detail below.

The circuit pattern layers as described above may be formed of at least one metal material selected from gold (Au), silver (Ag), platinum (Pt), titanium (Ti), tin (Sn), copper (Cu), and zinc (Zn). In addition, the circuit pattern layers may be formed of a paste or solder paste including at least one metal material selected from gold (Au), silver (Ag), platinum (Pt), titanium (Ti), tin (Sn), copper (Cu), and zinc (Zn) having excellent bonding strength. Preferably, the first to third circuit pattern layers 130, 140, and 150 may be formed of copper (Cu), which has high electrical conductivity and is relatively inexpensive.

The first circuit pattern layer 130, the second circuit pattern layer 140, and the third circuit pattern layer 150 may have a thickness in a range of 5 μm to 20 μm. For example, the first circuit pattern layer 130, the second circuit pattern layer 140, and the third circuit pattern layer 150 may have a thickness in a range of 6 μm to 17 μm. Each of the first circuit pattern layer 130, the second circuit pattern layer 140, and the third circuit pattern layer 150 may have a thickness in a range of 7 μm to 16 μm.

If each thickness of the first circuit pattern layer 130, the second circuit pattern layer 140, and the third circuit pattern layer 150 is less than 5 μm, a resistance of the circuit pattern increases, and thus the signal transmission efficiency may decrease. For example, if each thickness of the first circuit pattern layer 130, the second circuit pattern layer 140, and the third circuit pattern layer 150 is less than 5 μm, the signal transmission loss may increase. For example, if each thickness of the first circuit pattern layer 130, the second circuit pattern layer 140, and the third circuit pattern layer 150 exceeds 20 μm, line widths of the circuit patterns increases, and thus an overall volume of the circuit board may increase.

The first circuit pattern layer 130, the second circuit pattern layer 140, and the third circuit pattern layer 150 may be formed by an additive process, a subtractive process, a modified semi additive process (MSAP) and a semi additive process (SAP) method, which is a typical circuit board manufacturing process, and a detailed description thereof will be omitted herein.

The circuit board of the embodiment includes a through electrode. The through electrode may function to electrically connect circuit pattern layers disposed on different layers to each other. The through electrode may also be referred to as 'via'.

The through electrode passes through the first insulating layer 110 and the second insulating layer 120 included in a circuit board, and accordingly, circuit patterns disposed on different layers may be electrically connected. In this case, the through electrode may be formed to pass through only one insulating layer, and unlike this, may be formed by commonly passing through at least two or more insulating layers.

For example, the circuit board includes a first through electrode V1. The first through electrode V1 may be formed to pass through the first insulating layer 110. The first through electrode V1 may electrically connect the first circuit pattern layer 130 and the third circuit pattern layer 150. For example, an upper surface of the first through electrode V1 may be directly connected to a lower surface of the first circuit pattern layer 130. For example, a lower surface of the first through electrode V1 may be directly connected to the third circuit pattern layer 150.

Accordingly, the first circuit pattern layer 130 and the third circuit pattern layer 150 may be electrically connected to each other through the first through electrode V1 to transmit a signal.

For example, the circuit board includes a second through electrode V2. The second through electrode V2 may be formed to pass through the second insulating layer 120. The second through electrode V2 may electrically connect the first circuit pattern layer 130 and the second circuit pattern layer 140. For example, a lower surface of the second through electrode V2 may be directly connected to the first circuit pattern layer 130. For example, an upper surface of the second through electrode V2 may be directly connected to the second circuit pattern layer 140. Accordingly, the first circuit pattern layer 130 and the second circuit pattern layer 140 may be directly electrically connected to each other through the second through electrode V2 to transmit a signal.

The first through electrode V1 and the second through electrode V2 may be formed by forming a through hole passing through the first insulating layer 110 and the second insulating layer 120 and filling an inside of the formed through hole with a conductive material.

The through hole may be formed by any one of machining methods, including mechanical, laser, and chemical processing. When the through hole is formed by mechanical processing, methods such as milling, drilling, and routing may be used, and when the through hole is formed by laser processing, a UV or $CO_2$ laser method may be used, and when the through hole is formed by chemical processing, drugs containing amino silane, ketones, etc. may be used, and the like, thereby at least one insulating layer among the plurality of insulating layers may be opened.

On the other hand, the processing by the laser is a cutting method that takes the desired shape to melt and evaporate a part of the material by concentrating optical energy on the surface, it can easily process complex formations by computer programs, and can process composite materials that are difficult to cut by other methods.

In addition, the processing by the laser can have a cutting diameter of at least 0.005 mm, and has a wide advantage in a range of possible thicknesses.

As the drill for the laser processing, it is preferable to use a YAG (Yttrium Aluminum Garnet) laser, a $CO_2$ laser, or an ultraviolet (UV) laser. The YAG laser is a laser that can process both the copper foil layer and the insulating layer, and the $CO_2$ laser is a laser that can process only the insulating layer.

When the through hole is formed, the first through electrode V1 and the second through electrode V2 may be formed by filling the inside of the through hole with a conductive material. A metal material forming the first through electrode V1 and the second through electrode V2 may be any one material selected from Cu, Ag, Sn, Au, Ni, and Pd, and the metal material may be filled using any one or a combination of electroless plating, electrolytic plating, screen printing, sputtering, evaporation, ink jetting and dispensing.

Meanwhile, the circuit board of an embodiment may include a first protective layer 160 and a second protective layer 170. The first protective layer 160 and the second protective layer 170 may be disposed at outermost sides of the circuit board.

For example, the first protective layer 160 may be disposed at a first outermost or lowermost side of the circuit board. For example, the first protective layer 160 may be disposed on a lower surface of the first insulating layer 110.

For example, the second protective layer 170 may be disposed at the second outermost or uppermost side of the circuit board. For example, the second protective layer 170 may be disposed on the upper surface of the second insulating layer 120.

The first protective layer 160 may include at least one opening (not shown). For example, the first protective layer 160 may include an opening vertically overlapping at least one of the third circuit pattern layers 150. For example, the first protective layer 160 may include an opening vertically overlapping a terminal pad (not shown) of the third circuit pattern layer 150 on which a conductive coupling part for connection with an external substrate is to be disposed.

The second protective layer 170 may include at least one opening (not shown). For example, the second protective layer 170 may include an opening vertically overlapping at least one of the second circuit pattern layers 140. For example, the second protective layer 170 may include an opening vertically overlapping a terminal pad (not shown) of the second circuit pattern layer 140 on which a conductive coupling part for connection with a memory substrate or an interposer substrate is to be disposed. In addition, the second protective layer 170 may include a through hole 171 vertically overlapping the cavity 121 of the second insulating layer 120.

The first protective layer 160 and the second protective layer 170 may include an insulating material. The first protective layer 160 and the second protective layer 170 may include various materials that may be cured by being applied and then heating to protect surfaces of insulating layers and circuit pattern layers. The first protective layer 160 and the second protective layer 170 may be resist layers. For example, the first protective layer 160 and the second protective layer 170 may be solder resist layers including an organic polymer material. For example, the first protective layer 160 and the second protective layer 170 may include an epoxy acrylate-based resin. Specifically, the first protective layer 160 and the second protective layer 170 may include a resin, a curing agent, a photo initiator, a pigment, a solvent, a filler, an additive, an acrylic-based monomer, etc. However, the embodiment is not limited thereto, and the first protective layer 160 and the second protective layer 170 may be any one of a photo solder resist layer, a cover-lay, and a polymer material.

The first protective layer 160 and the second protective layer 170 may have a thickness of about 1 μm to about 20 μm. The first protective layer 160 and the second protective layer 170 may have a thickness of about 1 μm to about 15 μm. For example, the first protective layer 160 and the second protective layer 170 may have a thickness of about 5 μm to about 20 μm. If the thicknesses of the first protective layer 160 and the second protective layer 170 are greater than about 20 μm, the thickness of the circuit board may increase. If the thicknesses of the first protective layer 160 and the second protective layer 170 are less than about 1 μm, the electrical reliability or the physical reliability may deteriorate because circuit pattern layers included in the circuit board are not stably protected.

In this case, although not illustrated in the drawings, a surface treatment layer (not shown) may be disposed within openings of the first protective layer 160 and the second protective layer 170, which vertically overlap the second circuit pattern layer 140 and the third circuit pattern layer 150. The surface treatment layer may be formed to improve soldering properties while preventing corrosion and oxidation of surfaces of the third circuit pattern layer 150 and the second circuit pattern layer 140 vertically overlapping the opening of the first protective layer 160.

The surface treatment layer may be an organic solderability preservation (OSP) layer. For example, the surface treatment layer may be an organic layer formed of an organic material such as benzimidazole.

However, the embodiment is not limited thereto. For example, the surface treatment layer may be a plating layer. For example, the surface treatment layer may include at least one of a nickel (Ni) plating layer, a palladium (Pd) plating layer, and a gold (Au) plating layer.

Meanwhile, in an embodiment, the second insulating layer 120 may include a cavity 121. The cavity 121 may pass through the upper and lower surfaces of the second insulating layer 120. The cavity 121 may vertically overlap the first circuit pattern layer 130 disposed on the upper surface of the first insulating layer 110.

The cavity 121 of the first embodiment may be formed through a photolithography process. For example, the cavity 121 may be formed through exposure and development processes of the second insulating layer 120.

Accordingly, the embodiment may remove a stop layer required for forming the cavity 121. For example, in the comparative example, a cavity is formed through a laser process, and accordingly, a stop layer for forming the cavity is required.

For example, a circuit board according to a first comparative example includes a cavity C as shown in FIG. 4A. The circuit board according to the first comparative example includes a cavity C having a structure passing through at least one of a plurality of insulating layers.

Specifically, the circuit board of the first comparative example includes a first insulating layer 10a and a second insulating layer 20a disposed on the first insulating layer 10a. And, the cavity C is formed passing through the second insulating layer 20a. In addition, the circuit board includes a circuit pattern layer disposed on a surface of the insulating layer. For example, the circuit board includes a first circuit pattern layer 30a disposed on an upper surface of the first insulating layer 10a. In addition, the circuit board includes a second circuit pattern layer 40a disposed on a lower surface of the first insulating layer 10a. In addition, the circuit board includes a third circuit pattern layer 50a disposed on an upper surface of the second insulating layer 20a. In addition, the circuit board includes a through electrode 60a passing through the first insulating layer 10a. The through electrode 60a electrically connects the first circuit pattern layer 30a disposed on the upper surface of the first insulating layer 10a and the second circuit pattern layer 40a disposed on the lower surface of the first insulating layer 10a.

The upper surface of the first insulating layer 10a includes a first region R1 vertically overlapping the cavity C and a second region R2 excluding the first region. In addition, the first circuit pattern layer 30a may be disposed in the first region and the second region of the upper surface of the first insulating layer 10a, respectively.

At this time, in the first comparative example, a cavity C passing through the second insulating layer 20a may be formed using a stop layer (not shown).

Accordingly, the first circuit pattern layer 30a includes a pad part 32a disposed in a first region of the upper surface of the first insulating layer 10a, and a stop pattern 34a disposed in a second region of the upper surface of the first insulating layer 10a. The stop pattern 34a may be disposed at a boundary region between the first region and the second region on the upper surface of the first insulating layer 10a. For example, the stop pattern 34a is disposed in the second region of the upper surface of the first insulating layer 10a, and a side surface of the stop pattern may form a part of an inner wall of the cavity C. For example, the cavity C of the first comparative example may include a first inner wall including the second insulating layer 20a and a second inner wall including the stop pattern 34a.

In this case, as shown in FIG. 4B, in the first comparative example, the stop pattern 34a is disposed to surround the boundary region between the first region and the second region of the upper surface of the first insulating layer 10a. Accordingly, the first comparative example includes a process of forming a stop layer to form the cavity C and a process of forming the stop pattern 34a by removing the stop layer, and there is a problem in that the manufacturing process becomes complicated as a result. In addition, in the first comparative example, there is a problem that a portion of the pad part 32a of the first circuit pattern layer 30a is also etched during the etching process for removing the stop layer, as a result, there is a problem in that the pad part 32a is deformed. In addition, in the first comparative example, when the pad portion 32a is deformed, a reliability problem may occur in which a connection part such as a solder ball is not stably seated on the pad part 32a.

In addition, in the first comparative example, there is a problem that the pad part 32a disposed in the first region of the upper surface of the first insulating layer 10a cannot be directly connected to other pattern parts 36a disposed in the second region of the upper surface of the first insulating layer 10a. For example, in the first comparative example, the stop pattern 34a is disposed in the boundary region corresponding to the cavity C. Accordingly, when a connection pattern part such as a trace T connecting the pad part 32a and the pattern portion 36a is disposed, the trace T is electrically in contact with the stop pattern 34a, and thus an electrical reliability problem may occur. For example, in the first comparative example, when at least two traces T are disposed, the traces T may be electrically connected to each other by the stop pattern 34a, and accordingly, a short circuit problem may occur due to the fact that pad parts that must be electrically separated from each other are electrically connected to each other by the stop pattern 34a.

Accordingly, in the first comparative example, the pad part 32a and the pattern portion 36a are not directly connected to each other through traces, but are connected through the through electrode 60a. Therefore, the first comparative example does not have a structure in which the pad part 32a and the pattern portion 36 are directly connected to each other on the upper surface of the first insulating layer 10a, there is a problem that the length of the signal transmission line between them becomes longer, and as the length of the signal transmission line increases, it is vulnerable to noise and thus signal transmission loss increases.

In addition, as shown in FIG. 4C, in the second comparative example, the widths of the stop layer and the cavity 'C' are made the same, so that the stop pattern 34a is not remain on the circuit board. However, it is not easy to form the cavity (C) to substantially correspond to the width of the stop layer due to a process error in the laser process. In addition, when a width of the stop layer is greater than a width of the cavity C, there is a problem that a part of the stop pattern 34*a* as shown in FIG. 4A remains. Also, in the second comparative example, when the width of the stop layer is less than the width of the cavity C, the cavity C is also formed in a region in which the stop layer is not disposed, and accordingly, there is a problem in that a recess 10*r* is formed on the upper surface of the first insulating layer 10*a*. In addition, the recess 10*r* has a problem in that damage occurs in the second circuit pattern layer 40*a* disposed on the lower surface of the first insulating layer 10*a*, and accordingly, electrical reliability or physical reliability problems may occur.

In contrast, in the embodiment, the second insulating layer 120 is made of a photosensitive material as described above, and accordingly, a cavity 121 passing through the second insulating layer 120 is formed through a photolithography process rather than a laser process.

Accordingly, in the first circuit pattern layer 130 of the embodiment, a pattern part vertically overlapping the cavity 121 and a pattern part that do not vertically overlapping the cavity 121 may be directly connected to each other.

For example, referring to FIG. 2A, the upper surface of the first insulating layer 110 in the embodiment may include a first region R1 vertically overlapping the cavity 121 and a second region R2 other than the first region R1.

The first region R1 vertically overlaps the cavity 121, and accordingly, it may mean a device arrangement region in which a device to be mounted on a circuit board of an embodiment is disposed.

The second region R2 does not vertically overlap the cavity 121. Accordingly, the second region R2 of the first insulating layer 110 and the first circuit pattern layer 130 disposed on the second region R2 may be covered by the second insulating layer 120.

In this case, the first circuit pattern layer 130 in the embodiment may be disposed on the first region R1 and the second region R2 of the first insulating layer 110, respectively.

For example, the first circuit pattern layer 130 may include a first pad part 131 disposed in the first region R1 of the first insulating layer 110. For example, the first pad part 131 may refer to a mounting pad on which a device of the first circuit pattern layer 130 is to be mounted. For example, the first pad part 131 may vertically overlap the cavity 121, and thus may be disposed in the cavity 121.

The first circuit pattern layer 130 of the embodiment may include a second pad part 133 disposed in the second region R2 of the first insulating layer 110. The second pad part 133 may be disposed in the second region R2 of the first insulating layer 110, and thus, an upper surface of the second pad part 133 may be covered by the second insulating layer 120.

The second pad part 133 may mean a via pad. For example, the second pad part 133 does not vertically overlap the cavity 121.

In this case, in the first and second comparative examples, the first pad part 131 and the second pad part 133 do not have a structure directly connected to each other. For example, in the first and second comparative examples, the first pad part 131 and the second pad part 133 do not have a structure directly connected to each other through traces of the first circuit pattern layer 130. This is because, as described in FIGS. 4A to 4C, when a cavity is formed using a laser, a stop pattern is disposed in a region vertically overlapping an inclined surface of the cavity. For example, in the comparative example, a stop pattern is disposed in all regions vertically overlapping the inclined surface of the cavity.

Accordingly, in the comparative example, traces directly connecting the first pad part and the second pad part cannot be disposed by the stop pattern.

On the contrary, an embodiment forms the cavity 121 in the second insulating layer 120 made of a photosensitive material by using a photolithography process. Accordingly, an embodiment may remove a stop layer required to form the cavity 121 in the second insulating layer 120. Accordingly, an embodiment may include a connection pattern part 132 that directly connects the first pad part 131 and the second pad part 133.

The connection pattern part 132 may refer to a trace of the first circuit pattern layer 130.

Accordingly, the connection pattern part 132 may have a width smaller than a width of the first pad part 131 or a width of the second pad part 133.

One end of the connection pattern part 132 may be directly connected to the first pad part 131. In addition, the other end of the connection pattern part 132 may be directly connected to the second pad part 133.

Accordingly, the embodiment may have a structure in which the first pad part 131 and the second pad part 133 are directly connected to each other through the connection pattern part 132.

For example, in the comparative example, at least two through electrodes are required to connect the first pad part and the second pad part. For example, in the comparative example, the first pad part and the second pad part are connected to each other by using a first through electrode vertically overlapping the first pad part and the second through electrode vertically overlapping the second pad part. Accordingly, the comparative example allows a signal path including the first through electrode and the second through electrode to be additionally to connect the first pad part and the second pad part, compared to the embodiment. Accordingly, there is a problem that a signal line between the first pad part and the second pad part increases.

On the other hand, in an embodiment, the first pad part 131 and the second pad part 133 may be directly connected using the connection pattern part 132.

Accordingly, an embodiment may minimize a signal transmission distance between the first pad part 131 and the second pad part 133. Accordingly, an embodiment does not require a separate through electrode for connecting the first pad part 131 and the second pad part 133, and accordingly, an additional circuit pattern layer may be disposed in a space corresponding to the through electrode, thereby improving circuit integration.

In addition, in an embodiment, a signal transmission distance between the first pad part 131 and the second pad part 133 corresponds to a distance of the connection pattern part 132. Accordingly, in an embodiment, a signal transmission distance corresponding to a path including at least two through electrodes in the signal transmission distance may be reduced compared to a comparative example, thereby minimizing a signal transmission distance between the first pad part 131 and the second pad part 133. Furthermore, the embodiment may reduce a signal transmission distance between the first pad part 131 and the second pad part 133, thereby minimizing an effect of noise which increases in proportion to the signal transmission distance. Accordingly, an embodiment may improve signal transmission characteristics between the first pad part 131 and the second pad part 133, and further improve operation reliability of the circuit board.

Meanwhile, the connection pattern part 132 may be divided into a plurality of parts. In this case, the fact that the connection pattern part 132 is divided into a plurality of parts is only classified according to an arrangement region, and does not mean that one connection pattern part is divided into a plurality of parts separated from each other.

For example, the connection pattern part 132 may include a first portion 132-1 disposed adjacent to the first pad part 131.

One end of the first portion 132-1 of the connection pattern part 132 may be directly connected to the first pad part 131. The first portion 132-1 of the connection pattern part 132 may vertically overlap the cavity 121.

In addition, the connection pattern part 132 may include a second portion 132-2 disposed adjacent to the second pad part 133.

The second portion 132-2 of the connection pattern part 132 is connected to the other end of the first portion 132-1. In addition, one end of the second portion 132-2 of the connection pattern part 132 may be directly connected to the second pad part 133. The second portion 132-2 of the connection pattern part 132 may be covered with the second insulating layer 120.

At least a portion of the connection pattern part 132 may vertically overlap an inclined surface 121S of the second insulating layer 120 including the cavity 121. For example, a boundary portion between the first portion 132-1 and the second portion 132-2 of the connection pattern part 132 may vertically overlap the inclined surface 121S of the cavity 121 of the second insulating layer 120 including the cavity 121.

That is, the cavity 121 may include an inclined surface 121S whose width gradually decreases toward the upper surface of the first insulating layer 110. In addition, the inclined surface 121S of the second insulating layer 120 including the cavity 121 may vertically overlap at least a portion of the connection pattern part 132.

At this time, even in the comparative example, there is a pattern layer vertically overlapping the inclined surface of the cavity, but the pattern layer in the comparative example is a dummy pattern (e.g., a stop pattern) electrically separated (or insulated) from the first pad part or the second pad part. On the other hand, the connection pattern part 132 vertically overlapping the cavity in the embodiment is not a dummy pattern, but a wiring layer directly connecting the first pad part 131 and the second pad part 133.

Furthermore, the pattern layer of the comparative example overlaps the entire inclined surface of the cavity vertically. Specifically, in the comparative example, the pattern layer is disposed at all regions vertically overlapping the inclined surface.

On the other hand, the connection pattern part 132 in the embodiment may be disposed in a part of a region vertically overlapping the inclined surface 121S.

For example, as illustrated in FIG. 2A and FIG. 2B, the first pad part 131 includes a plurality of first pads. In addition, the second pad part 133 includes a plurality of second pads. In addition, the connection pattern part 132 includes a plurality of connection patterns connecting a plurality of first pads and a plurality of second pads, respectively. In addition, the plurality of connection patterns may be spaced apart from each other by a predetermined spacing. Accordingly, a part of the inclined surface 121S of the second insulating layer 120 including the cavity 121 in an embodiment may vertically overlap the connection pattern part 132 of the first circuit pattern layer 130, and at least a remaining portion of the inclined surface 121S may not vertically overlap the first circuit pattern layer 130.

Meanwhile, in an embodiment, the connection pattern part 132 as described above may be provided because the second insulating layer 120 is made of a photosensitive material as described above, and thus a cavity 121 is formed in the second insulating layer 120 through a photolithography process. In this case, the first insulating layer 110 includes an insulating material different from that of the second insulating layer 120. Accordingly, in the photolithography process for forming the cavity 121 in the second insulating layer 120, the first insulating layer 110 is not removed. Accordingly, an embodiment may form the cavity 121 passing through only the second insulating layer 120.

The embodiment includes a first insulating layer and a second insulating layer. At this time, the second insulating layer includes a cavity. Meanwhile, the second insulating layer includes a photosensitive material. Accordingly, the cavity may be formed in the second insulating layer by performing a photolithography process. In this case, in an embodiment, the cavity may be selectively formed only in the second insulating layer within a range in which the first insulating layer is not damaged without a stop layer. In this case, a first circuit pattern layer is disposed between the first insulating layer and the second insulating layer. The first circuit pattern layer includes a first pad part vertically overlapping the cavity and a second pad part that do not vertically overlapping the cavity. In addition, the first circuit pattern layer includes a connection pattern part directly connecting the first pad part and the second pad part. The connection pattern part may mean a trace of the first circuit pattern layer. One end of the connection pattern part may be directly connected to the first pad part. In addition, the other end of the connection pattern part may be directly connected to the second pad part.

Accordingly, the embodiment may have a structure in which the first pad part and the second pad part are directly connected to each other through the connection pattern part, and accordingly, signal transmission characteristics or operation reliability may be improved.

For example, in a comparative example, a stop layer is required to form a cavity, and accordingly, it was impossible to form the above-described connection pattern part. Accordingly, in the comparative example, at least two through electrodes are required to connect the first pad part and the second pad part. For example, the comparative example includes a first through electrode vertically overlapping the first pad part and a second through electrode vertically overlapping the second pad part, and accordingly, the first pad part and the second pad part are connected to each other. Accordingly, in order to connect the first pad part and the second pad part, the comparative example further includes a signal path including the first through electrode and the second through electrode compared to the embodiment, and accordingly, there is a problem that a signal line between the first pad part and the second pad part increases.

In contrast, the embodiment may directly connect the first pad part 131 and the second pad part using the connection pattern part. Accordingly, the embodiment may minimize a signal transmission distance between the first pad part and the second pad part. Accordingly, the embodiment does not require a separate through electrode for connecting the first pad part and the second pad part, and accordingly, an additional circuit pattern layer may be disposed in a space corresponding to the through electrode, thereby improving circuit integration.

In addition, in an embodiment, a signal transmission distance between the first pad part and the second pad part corresponds to a length of the connection pattern part. Accordingly, an embodiment may reduce a distance corresponding to a path including at least two through electrodes in the signal transmission distance compared to a comparative example, and thus, a signal transmission distance between the first pad part and the second pad part may be minimized. In addition, in an embodiment, as a signal transmission distance between the first pad part and the second pad part is reduced, an effect of noise increasing in proportion to the signal transmission distance may be minimized. Accordingly, the embodiment may improve signal transmission characteristics between the first pad part and the second pad part, and further improve operation reliability of the circuit board.

Meanwhile, an embodiment manages an inclination of an inclined surface 121S of the second insulating layer 120 and an arrangement structure of the second protective layer 170.

In an embodiment, the inclined surface 121S of the second insulating layer 120 is substantially close to 90 degrees, so that it is possible to solve the problem of increasing a size of the circuit board in a horizontal direction caused by the inclined surface 121S becoming greater than 90 degrees. In an embodiment, the second insulating layer 120 may include a photosensitive material, and accordingly, the inclined surface 121S may be substantially close to 90 degrees. However, it may be difficult for the inclined surface 121S to have exactly 90 degrees. In addition, even if process conditions for forming the inclined surface 121S of cavity 121 at 90 degrees are set, the inclined surface 121S may have a value greater than 90 degrees due to process deviations. In addition, if the inclined surface 121S has a value less than 90 degrees due to the process deviations, a reliability problem such as a device such as a chip being disposed in an inclined state in cavity 121 may occur.

Therefore, the embodiment allows the second insulating layer 120 including the cavity 121 to have an inclined surface 121S whose width gradually decreases from the lower surface of the second insulating layer 120 to the upper surface of the second insulating layer 120.

In this case, the inclined surface 121S includes a first end portion 121S1 adjacent to an upper surface of the second insulating layer 120 and a second end portion 121S2 adjacent to a lower surface of the second insulating layer 120. In this case, the embodiment manages a width between the first end portion 121S1 and the second end portion 121S2 of the inclined surface 121S of the second insulating layer 120. For example, the embodiment manages an inclination of the inclined surface 121S of the second insulating layer 120 to be substantially close to 90 degrees. In this case, the first end portion 121S1 and the second end portion 121S2 are formed based on a vertical cross section of the circuit board of the embodiment, and may mean an upper end portion and a lower end portion of the inclined surface connected to each other. For example, the first end portion 121S1 may mean an end portion adjacent to the upper surface of the second insulating layer 120 at one side of the cavity 121. In addition, the second end portion 121S2 may be an end portion adjacent to the lower surface of the second insulating layer 120 at the one side of the cavity 121. In addition, the first end portion 121S1 and the second end portion 121S2 may be connected to each other based on a vertical cross-section.

In an embodiment, a width W1 between the first end portion 121S1 and the second end portion 121S2 of the inclined surface 121S of the second insulating layer 120 satisfies a range of 0.1 $\mu$m to 25 $\mu$m. For example, the width W1 between the first end portion 121S1 and the second end portion 121S2 of the inclined surface 121S of the second insulating layer 120 satisfies a range of 0.2 $\mu$m to 23 $\mu$m. For example, the width W1 between the first end portion 121S1 and the second end portion 121S2 of the second insulating layer 120 satisfies a range of 0.5 $\mu$m to 20 $\mu$m.

The width W1 between the first end portion 121S1 and the second end portion 121S2 may mean a horizontal distance of a virtual horizontal line connecting the first end portion 121S1 and the second end portion 121S2.

In this case, if the width W1 between the first end portion 121S1 and the second end portion 121S2 is less than 0.1 $\mu$m, the inclined surface 121S of the second insulating layer may have an inclination whose width decreases from the lower surface toward the upper surface due to a deviation in a process of forming the cavity 121. In addition, if the inclined surface 121S has an inclination that decreases in width from the lower surface to the upper surface, the position of the chip may be misaligned during a process of mounting the chip in cavity 121. In addition, if the width W1 between the first end portion 121S1 and the second end portion 121S2 is greater than 25 $\mu$m, there is a problem that the size of the cavity 121 is larger than the size of the chip disposed in the cavity 121. Accordingly, there is a problem in that the degree of integration of a circuit is reduced or the size of the circuit board in the horizontal direction is increased. Accordingly, in an embodiment, the width W1 between the first end portion 121S1 and the second end portion 121S2 of the second insulating layer 120 including the cavity 121 is within a range of 0.1 $\mu$m to 25 $\mu$m.

Meanwhile, as described above, the second protective layer 170 includes a through hole 171 vertically overlapping the cavity 121. In this case, the through hole 171 may have a width greater than that of the cavity 121. Preferably, the through hole 171 may be greater than a width of a region adjacent to the upper surface of the second insulating layer 120 among an entire region of the cavity 121.

Accordingly, at least a portion of an upper surface of the second insulating layer 120 may not be covered by the second protective layer 170. For example, a region adjacent to the first end portion 121S1 of the inclined surface 121S of the cavity 121 in the upper surface of the second insulating layer 120 may vertically overlap the through hole 171 of the second protective layer 170.

For example, the second insulating layer 120 may include an upper surface region 120T1 adjacent to the first end portion 121S1 of the inclined surface 121S and vertically overlapping the through hole 171 of the second protective layer 170.

In this case, the embodiment manages a width of the upper surface region 120T1 of the second insulating layer 120. In this case, when the width of the upper surface region 120T1 is less than a reference range, a problem that at least a portion of the second protective layer 170 fills the cavity 121 may occur. In addition, if the width of the upper surface region 120T1 is greater than the reference range, an area of an exposed region of the second insulating layer 120, which is not covered by the second protective layer 170, increases, thereby causing a problem that the upper surface of the second insulating layer 120 is damaged due to various factors. In addition, the upper surface region 120T1 may function as a dead region in a circuit board in which a circuit pattern layer is not disposed. In this case, if the width of the upper surface region 120T1 increases, it means that the width of the dead region increases, and accordingly, there is a problem that the circuit integration decreases or the size of the circuit board increases.

Accordingly, a width W2 of the upper surface region 120T1 of the second insulating layer 120 in an embodiment satisfies a range of 50 $\mu$m to 80 $\mu$m. For example, the width W2 of the upper surface region 120T1 of the second insulating layer 120 in an embodiment may satisfy a range of 55 μm to 75 μm. For example, the width W2 of the upper surface region 120T1 of the second insulating layer 120 in an embodiment may satisfy a range of 60 μm to 70 μm.

Meanwhile, a width W2 of the upper surface region 120T1 of the second insulating layer 120 may mean a horizontal distance between a side surface 170S of the second protective layer 170 and the first end portion 121S1 of the inclined surface 121S. For example, the second protective layer 170 includes a side surface 170S disposed adjacent to the first end portion 121S1 of the second insulating layer 120 and formed by the through hole 171. Accordingly, the side surface 170S may mean an inclined surface of the second protective layer 170 formed through the through hole 171. For example, the side surface 170S may mean an inner wall of the through hole 171 of the second protective layer 170. And, the width W2 of the upper surface region 120T1 of the second insulating layer 120 may mean a horizontal distance between the side surface 170 of the second protective layer 170 and the first end portion 121S1 of the inclined surface 121S of the second insulating layer 120.

Meanwhile, if the width W2 of the upper surface region 120T1 of the second insulating layer 120 is less than 50 μm, a problem that at least a portion of the second protective layer 170 vertically overlaps the second cavity 121 may occur due to a process deviation in a solder resist opening (SRO) process of forming the through hole 171 in the second protective layer 170. For example, if the width W2 of the upper surface region 120T1 of the second insulating layer 120 is less than 50 μm, a problem that at least a portion of the cavity 121 is covered by the second protective layer 170 may occur, and thus reliability in the chip mounting process may be deteriorated. In addition, if the width W2 of the upper surface region 120T1 of the second insulating layer 120 is greater than 80 μm, the width of the dead region may increase due to the upper surface region 120T1, and thus the circuit integration may decrease or the size of the circuit board may increase.

Meanwhile, a second circuit pattern layer 140 is disposed on the second insulating layer 120. In addition, the second circuit pattern layer 140 is spaced apart from the first end portion 121S1 of the inclined surface 121S of the second insulating layer 120, and does not vertically overlap the upper surface region 120T1 of the second insulating layer 120.

For example, the second circuit pattern layer 140 includes an adjacent pattern disposed closest to the first end portion 121S1 of the inclined surface 121S. In addition, the adjacent pattern may be spaced apart from the first end portion 121S1 of the inclined surface 121S of the second insulating layer 120 by a predetermined spacing.

For example, a pattern of the second circuit pattern layer 140 disposed closest to the side surface 170S of the second protective layer 170 may be spaced apart from the side surface 170S of the second protective layer 170 by a first spacing W3. The first spacing W3 may mean a horizontal distance between the side surface 170S of the second protective layer 170 and a side surface of the closest adjacent pattern.

The first spacing W3 between the adjacent pattern and the side surface 170S of the second protective layer 170 may satisfy a range between 55 and 95 μm. For example, the first spacing W3 between the adjacent pattern and the side surface 170S of the second protective layer 170 may satisfy a range between 60 to 90 μm. For example, the first spacing W3 between the adjacent pattern and the side surface 170S of the second protective layer 170 may satisfy a range between 65 μm and 85 μm.

In this case, if the first spacing W3 between the adjacent pattern and the side surface 170S of the second protective layer 170 is less than 55 μm, a problem that the adjacent pattern vertically overlaps the through hole 171 of the second protective layer 170 may occur, and thus a problem that the upper surface of the adjacent pattern is not covered by the second protective layer 170 may occur. In addition, if the upper surface of the adjacent pattern is not covered by the second protective layer 170, a problem that the upper surface of the adjacent pattern is damaged due to various factors may occur. In addition, if the upper surface of the adjacent pattern is damaged, a surface roughness of the adjacent pattern may increase, and thus signal transmission loss due to the skin effect may increase. In addition, if the upper surface of the adjacent pattern is damaged, a problem that the adjacent pattern may not normally perform a function as a signal wiring may occur, thereby causing an electrical reliability problem.

Meanwhile, when the first spacing W3 between the adjacent pattern and the side surface 170S of the second protective layer 170 is greater than 95 μm, a problem in that the circuit integration decreases and thus the size of the circuit board increases may occur. That is, the first spacing W3 may correspond to a spacing of a dead region in which the second circuit pattern layer 140 is not disposed. In addition, as the first spacing W3 increases, an area of the dead region increases, and accordingly, a problem in that the circuit integration decreases or a size of the circuit board increases may occur.

As described above, the embodiment manages the width W1 between the first end portion 121S1 and the second end portion 121S2 of the inclined surface 121S of the second insulating layer 120 including the cavity 121. Furthermore, the embodiment manages the width W2 of the upper surface region 120T1 of the second insulating layer 120 vertically overlapping the through hole 171 of the second protective layer 170. In addition, the embodiment manages a spacing between the side surface 170S and the adjacent pattern disposed closest to the side surface 170S of the second protective layer 170 among the second circuit pattern layers 140. Accordingly, an embodiment may improve circuit integration while improving the physical reliability and electrical reliability of the circuit board, thereby slimming the size of the circuit board.

The embodiment includes a first insulating layer and a second insulating layer. At this time, the second insulating layer includes a cavity. Meanwhile, the second insulating layer includes a photosensitive material. Accordingly, the cavity may be formed in the second insulating layer by performing a photolithography process. In this case, in an embodiment, the cavity may be selectively formed only in the second insulating layer within a range in which the first insulating layer is not damaged without a stop layer. In this case, a first circuit pattern layer is disposed between the first insulating layer and the second insulating layer. The first circuit pattern layer includes a first pad part vertically overlapping the cavity and a second pad part that do not vertically overlapping the cavity. In addition, the first circuit pattern layer includes a connection pattern part directly connecting the first pad part and the second pad part. The connection pattern part may mean a trace of the first circuit pattern layer. One end of the connection pattern part may be directly connected to the first pad part. In addition, the other end of the connection pattern part may be directly connected to the second pad part.

Accordingly, the embodiment may have a structure in which the first pad part and the second pad part are directly connected to each other through the connection pattern part, and accordingly, signal transmission characteristics or operation reliability may be improved.

For example, in a comparative example, a stop layer is required to form a cavity, and accordingly, it was impossible to form the above-described connection pattern part. Accordingly, in the comparative example, at least two through electrodes are required to connect the first pad part and the second pad part. For example, the comparative example includes a first through electrode vertically overlapping the first pad part and a second through electrode vertically overlapping the second pad part, and accordingly, the first pad part and the second pad part are connected to each other. Accordingly, in order to connect the first pad part and the second pad part, the comparative example further includes a signal path including the first through electrode and the second through electrode compared to the embodiment, and accordingly, there is a problem that a signal line between the first pad part and the second pad part increases.

In contrast, the embodiment may directly connect the first pad part 131 and the second pad part using the connection pattern part. Accordingly, the embodiment may minimize a signal transmission distance between the first pad part and the second pad part. Accordingly, the embodiment does not require a separate through electrode for connecting the first pad part and the second pad part, and accordingly, an additional circuit pattern layer may be disposed in a space corresponding to the through electrode, thereby improving circuit integration.

In addition, in an embodiment, a signal transmission distance between the first pad part and the second pad part corresponds to a length of the connection pattern part. Accordingly, an embodiment may reduce a distance corresponding to a path including at least two through electrodes in the signal transmission distance compared to a comparative example, and thus, a signal transmission distance between the first pad part and the second pad part may be minimized. In addition, in an embodiment, as a signal transmission distance between the first pad part and the second pad part is reduced, an effect of noise increasing in proportion to the signal transmission distance may be minimized. Accordingly, the embodiment may improve signal transmission characteristics between the first pad part and the second pad part, and further improve operation reliability of the circuit board.

FIG. 5 is a view illustrating a circuit board according to a second embodiment.

Referring to FIG. 5, the circuit board may have a plurality of cavities formed in the second insulating layer 120 of the circuit board of FIG. 1.

For example, the second insulating layer 120 may include a first cavity 121 and a second cavity 122 spaced apart from the first cavity 121 in a horizontal direction.

In this case, the first cavity 121 and the second cavity 122 may be spaced apart from each other by a second spacing W4.

For example, the second insulating layer 120 includes a first end portion 121S1 of a first inclined surface 121S of a first cavity 121 adjacent to an upper surface of the second insulating layer 120. In addition, a third end portion 122S1 of a second inclined surface of the second cavity 122 is provided adjacent to an upper surface of the second insulating layer 120 and adjacent to the first end portion 121S1 of the first cavity 121. In addition, the second spacing W4 may mean a horizontal distance between the first end portion 121S1 and the third end portion 122S1.

The second spacing W4 may satisfy a range between 100 μm and 150 μm. For example, the second spacing W4 may satisfy a range between 105 μm and 145 μm. For example, the second spacing W4 may satisfy a range between 110 μm and 150 μm.

If the second spacing W4 is less than 100 μm, a space for disposing the second circuit pattern layer 140 on the upper surface of the region between the first cavity 121 and the second cavity 122 among the upper surfaces of the second insulating layer 120 may not be provided. Accordingly, a problem of decreasing circuit integration may occur. In addition, if the second spacing W4 is less than 100 μm, a problem may occur in a process of forming the cavity in which the first cavity 121 and the second cavity 122 are connected to each other. In addition, if the second spacing W4 is less than 100 μm, a distance between a first chip disposed in the first cavity 121 and a second chip disposed in the second cavity 122 may be reduced, thereby deteriorating operation characteristics due to signal interference therebetween.

Meanwhile, if the second spacing W4 is greater than 150 μm, the distance between the first chip and the second chip increases, and thus a length of a signal line connecting the first chip and the second chip may increase. In addition, if the length of the signal line increases, a signal transmission loss increases, and thus signal characteristics may be deteriorated.

FIG. 6 is a view illustrating a circuit board according to a third embodiment, and FIG. 7 is a cross-sectional view taken along a direction A-A' of FIG. 2B with respect to the circuit board of a third embodiment.

Referring to FIGS. 6 and 7, a circuit board according to a third embodiment has a structure similar to that of the circuit board according to the first embodiment of FIG. 1, and may be different from an insulating material constituting the first insulating layer and a position of the first circuit pattern layer.

Specifically, the circuit board according to the second embodiment may include a first insulating layer 210, a second insulating layer 220, a first circuit pattern layer 230, a second circuit pattern layer 240, a third circuit pattern layer 250, a first through electrode V1, a second through electrode V2, a first protective layer 260, and a second protective layer 270.

In the second embodiment, the first insulating layer 210 may include the same insulating material as the second insulating layer 220.

For example, the first insulating layer 210 may include a photosensitive material, which is the same insulating material as the second insulating layer 220.

In addition, the embodiment allows a cavity 221 to be formed by processing at least a portion of insulating layers of a photosensitive material composed of a plurality of layers.

In this case, when the first insulating layer 210 and the second insulating layer 220 include the same material, the circuit board may be manufactured through an Embedded Trace Substrate (ETS) method.

Accordingly, the first circuit pattern layer 230 may protrude above the upper surface of the first insulating layer 210.

In this case, the first insulating layer 210 and the second insulating layer 220 include a photosensitive material, and in the embodiment, only the second insulating layer 220 is selectively processed to form a cavity 221.

Here, the embodiment selectively processes only the second insulating layer 220 among the first insulating layer 210 and the second insulating layer 220 through a thinning method. The thinning method may mean a method of reducing a thickness of unexposed and uncured region after a region to be processed is unexposed and uncured.

In this case, in an embodiment, it is difficult to selectively process only the second insulating layer 220 among the first insulating layer 210 and the second insulating layer 220 by using the thinning method. Accordingly, in an embodiment, in the process of forming the cavity 221 in the second insulating layer 220, process conditions and processing time are adjusted to process a part of the second insulating layer 220 without performing a processing process of entirely penetrating the second insulating layer 220.

Accordingly, a lower surface of the cavity 221 of the second insulating layer 220 in an embodiment may be positioned higher than a lower surface of the first circuit pattern layer 230.

For example, in an embodiment, a lower surface of the cavity 221 of the second insulating layer 220 in a region vertically overlapping the cavity 221 is higher than the lower surface of the first circuit pattern layer 230 and lower than the upper surface of the first circuit pattern layer 230.

For example, the second insulating layer 220 in an embodiment may include a supporting insulating part 220B vertically overlapping the cavity 221. In addition, an upper surface of the supporting insulating part 220B may correspond to a lower surface of the cavity 221 of the second insulating layer 220.

The supporting insulating part 220B may be disposed between the first circuit pattern layers 230 in a region vertically overlapping the cavity 221.

That is, the third embodiment has a structure in which the first circuit pattern layer 230 protrudes above the upper surface of the first insulating layer 210. In addition, the cavity 221 of the second insulating layer 220 may be formed in a structure that does not pass through the second insulating layer 221.

For example, the first circuit pattern layer 230 includes a first pad part 231 and a connection pattern part 232 vertically overlapping the cavity 221.

In this case, each of the first pad part 231 and the connection pattern part 232 may be configured in plural.

In addition, as shown in FIGS. 6 and 7, the supporting insulating part 220B may be disposed between a plurality of first pad parts, between a plurality of connection pattern parts, and between at least one first pad part and at least one connection pattern part.

In this case, the supporting insulating part 220B may function to protect the first insulating layer 210 in a process of processing the cavity 221.

In addition, the connection pattern part 232 corresponds to a trace which is a fine pattern connecting the first pad part 231 and the second pad part 233. In this case, if the connection pattern part 232 has a structure protruding above the upper surface of the first insulating layer 210 and vertically overlaps the cavity 221, a physical reliability problem may occur in which the connection pattern part 232 collapses due to various factors. At this time, the embodiment allows a supporting insulating part 220B that is a part of the second insulating layer 220 to be provided in a region vertically overlapping the cavity 221. In addition, the supporting insulating part 220B may function to protect the first pad part 231 and the connection pattern part 232 vertically overlapping the cavity 221 in addition to protecting the upper surface of the first insulating layer 210. For example, the connection pattern part 232 may be supported by the supporting insulating part 220B in a region vertically overlapping the cavity 221, thereby solving physical reliability problems such as collapsing.

Meanwhile, a thickness of the supporting insulating part 220B may have a range between 20% and 95% of a thickness of the first circuit pattern layer 230. For example, the thickness of the supporting insulating part 220B may have a range between 25% and 90% of the thickness of the first circuit pattern layer 230. For example, the thickness of the supporting insulating part 220B may have a thickness between 30% and 85% of the thickness of the first circuit pattern layer 230.

If the thickness of the supporting insulating part 220B is less than 20% of the thickness of the first circuit pattern layer 230, a problem in which the cavity 221 is also formed in the first insulating layer 210 may occur due to a deviation in the process of forming the cavity 221. If the thickness of the supporting insulating part 220B is less than 20% of the thickness of the first circuit pattern layer 230, a problem in which the connection pattern part 232 is not stably supported may occur in a region vertically overlapping the cavity 221, thereby causing a physical reliability problem such as the collapse of the connection pattern part from various factors.

If the thickness of the supporting insulating part 220B exceeds 95% of the thickness of the first circuit pattern layer 230, at least a part of the supporting insulating part 220B may cover an upper surface of the first pad part 231 due to a deviation in the process of forming the cavity 221, thereby causing an electrical reliability problem in which electrical connection with a device mounted on the first pad part 231 is not normally achieved.

FIG. 8 is a view illustrating a circuit board according to a fourth embodiment.

Referring to FIG. 8, a circuit board according to a fourth embodiment has a structure similar to that of the circuit board according to the third embodiment of FIGS. 6 and 7, and may further include a third insulating layer.

Specifically, the circuit board according to the third embodiment may include a first insulating layer 310, a second insulating layer 320, a third insulating layer 380, a first circuit pattern layer 330, a second circuit pattern layer 340, a third circuit pattern layer 350, a fourth circuit pattern layer 390, a first through electrode V2, a third through electrode V3, a first protective layer 360, and a second protective layer 370.

In the third embodiment, the first insulating layer 310 may include the same insulating material as the second insulating layer 320. For example, the first insulating layer 310 may include a photosensitive material which is the same insulating material as the second insulating layer 320.

Meanwhile, the third insulating layer 380 is disposed on a lower surface of the first insulating layer 310.

The third insulating layer 380 may include an insulating material different from that of the first insulating layer 310. For example, the third insulating layer 380 may include a prepreg. Specifically, in the circuit board, when the insulating layer is made of only a photosensitive material, a problem may occur in rigidity of the circuit board, and further, warpage characteristics may be deteriorated. This is because a configuration such as glass fiber does not exist in the insulating layer including the photosensitive material.

Accordingly, the embodiment further disposes a third insulating layer 380 under the first insulating layer 310 to improve the rigidity of the circuit board and improve the warpage characteristics.

FIG. 9 is a view illustrating a circuit board according to a fifth embodiment, and FIG. 10 is a plan view of a state in which some layers are removed from the circuit board of FIG. 9.

Referring to FIGS. 9 and 10, the circuit board according to the first embodiment of FIG. 1 may have a structure similar to that of the circuit board, and may have a difference in a material constituting the second insulating layer.

Specifically, a circuit board according to a fifth embodiment may include a first insulating layer 410, a second insulating layer 420, a first circuit pattern layer 430, a second circuit pattern layer 440, a third circuit pattern layer 450, a first through electrode V1, a second through electrode V2, a third through electrode V3, a first protective layer 460, and a second protective layer 470.

In the fifth embodiment, the second insulating layer 420 may be formed of an insulating material that does not include a glass fiber. For example, the second insulating layer 420 may include an Ajinomoto build-up film (ABF) or a resin coated copper (RCC). Accordingly, a cavity 421 may be formed in the second insulating layer 420 through a laser process. However, the fifth embodiment allows the cavity 421 formed in the second insulating layer 420 to satisfy the first width W1, the second width W2, and the first spacing W3 described in FIG. 3.

Meanwhile, the first circuit pattern layer 430 may have a structure different from that of the first circuit pattern layer of the first embodiment. For example, the first circuit pattern layer 130 of the first embodiment includes the first pad part 131, the second pad part 133, and the connection pattern part 132.

Alternatively, the cavity 421 in the fifth embodiment is formed through a laser process and, thus, may not include the connection pattern part. For example, the first circuit pattern layer 430 includes the first pad part 431 and the second pad part 433. Also, the first circuit pattern layer 430 includes the third pad part 432 between the first pad part and the second pad part. The third pad part 432 may vertically overlap an inclined surface of the cavity 421 of the second insulating layer 420. The third pad part 432 may be a laser stopper used in a laser process of forming the cavity 421. Thus, as illustrated in FIG. 10, the third pad part 432 may be disposed at a boundary region between the first region R1 and the second region R2. Specifically, the third pad part 432 may be formed to surround the boundary region.

Hereinafter, a semiconductor package according to an embodiment will be described.

FIG. 11 is a view illustrating a first semiconductor package according to an embodiment.

Referring to FIG. 11, a first semiconductor package includes a first circuit board.

The first circuit board may refer to any one of the circuit boards shown in FIGS. 1, 5 to 9. Hereinafter, it is assumed that the first circuit board is the circuit board shown in FIG. 1. However, the embodiment is not limited thereto, and the first circuit board may be configured as any one of the circuit boards of FIGS. 5 to 9.

The first semiconductor package includes a first conductive coupling part 510 disposed on the first pad part 131 of the first circuit board.

The first conductive coupling part 510 may be disposed on a plurality of first pad parts 131 of the first circuit board, respectively.

The first conductive coupling part 510 may have a spherical shape. For example, a cross section of the first conductive coupling part 510 may have a circular shape or a semicircular shape. For example, a cross section of the first conductive coupling part 510 may have a partially or entirely rounded shape. For example, a cross sectional shape of the first conductive coupling part 510 may be a flat surface at one side and may have a curved surface at the other side. The first conductive coupling part 510 may be a solder ball, but is not limited thereto.

An embodiment may include a chip 520 or a device 520 disposed on the first conductive coupling part 510.

The chip 520 may be a processor chip. For example, the chip 520 may be an application processor (AP) chip of any one of a central processor (e.g., a CPU), a graphic processor (e.g., a GPU), a digital signal processor, an encryption processor, a microprocessor, and a microcontroller.

In this case, a terminal 525 may be provided at a lower surface of the chip 520, and the terminal 525 may be electrically connected to the first pad part 131 of the first circuit board through the first conductive coupling part 510.

Meanwhile, the semiconductor package according to an embodiment may include a plurality of chips disposed on one circuit board to be spaced apart from each other by a predetermined spacing. For example, the chip 520 may include a first chip and a second chip spaced apart from each other.

For example, the first circuit board may include a plurality of cavities spaced apart in a widthwise direction or a lengthwise direction, as illustrated in FIG. 5. In addition, each of the first chip and the second chip may be disposed in the plurality of cavities. In this case, at least one of terminals of the first chip should be directly connected to at least one of terminals of the second chip. In this case, the embodiment include a connection pattern part directly connected to the first pad part disposed in the cavity. In addition, a terminal of the first chip and a terminal of the second chip may be directly connected through the connection pattern part. For example, the connection pattern part may include a first portion vertically overlapping a first cavity in which the first chip is disposed, a second portion vertically overlapping a second cavity in which the second chip is disposed, and a third portion connecting the first portion and the second portion and not vertically overlapping the first and second cavities. In addition, the embodiment may directly connect a plurality of chips without a through electrode using the structure of the connection pattern part.

In addition, the first chip and the second chip may be different types of application processor (AP) chips.

Meanwhile, the first semiconductor package includes a second conductive coupling part 430 disposed in an opening of the first protective layer 170.

In this case, the second conductive coupling part 430 may be a solder ball, but is not limited thereto.

In an embodiment, an uppermost end of the second conductive coupling part 430 may be located lower than an uppermost end of the chip 420.

In a comparative example, the second conductive coupling part is used to couple the second circuit board on the first circuit board, and the second conductive coupling part is positioned higher than an upper end of the chip. This is to prevent the chip 420 from being damaged by the second circuit board when the second circuit board is coupled.

On the other hand, the second conductive coupling part 430 in an embodiment is located lower than an upper end of the chip 420. In addition, the embodiment may prevent the chip 420 from being damaged in the process of coupling the second circuit board on the second conductive coupling part 430 even if the second conductive coupling part 430 is located lower than the chip 420.

Meanwhile, an embodiment includes a third conductive coupling part 440 disposed in the opening of the first protective layer 160. The third conductive coupling part 440 may be configured to couple the first semiconductor package with a main board (or motherboard) of an external device.

FIG. 12 is a view illustrating a second semiconductor package according to an embodiment.

Referring to FIG. 12, a second semiconductor package according to the embodiment further includes a second circuit board 600 coupled to the first semiconductor package of FIG. 11.

The second circuit board 600 may be an interposer substrate.

The second circuit board 600 includes a plurality of insulating layers. For example, the second circuit board 600 may include a first insulating layer 610 and a second insulating layer 620.

In addition, the second circuit board 600 may include circuit pattern layers 630, 640, and 650 disposed on surfaces of the first insulating layer 610 and the second insulating layer 620. The circuit pattern layers 630, 640, and 650 of the second circuit board 600 may be formed according to a terminal standard between the first circuit board and a memory substrate (not shown). For example, a width or a pitch of a pad of the second circuit pattern layers of the first circuit board may be different from the width or pitch of a pad of the memory substrate. In addition, the second circuit board 600 may be disposed between the first circuit board and the memory substrate having the above difference to electrically connect the first circuit board and the memory substrate.

Meanwhile, the second circuit board 600 may include a second cavity 611. In this case, the second cavity 611 of the second circuit board 600 may vertically overlap the cavity 121 of the first circuit board. For example, the second cavity 611 may be formed to pass through the first insulating layer 610 of the second circuit board 600 facing the first circuit board.

In this case, at least a portion of the chip 520 mounted on the first circuit board in the embodiment may be disposed in the second cavity 611 of the second circuit board 600. Accordingly, the embodiment may reduce a height of the second conductive coupling part 630 based on a depth of the second cavity 611, thereby reducing the overall thickness of the second semiconductor package.

Meanwhile, the first insulating layer 610 of the second circuit board 600 may include a prepreg, and differently, may include a PID of a photosensitive material. And, when the first insulating layer 610 of the second circuit board 600 includes a prepreg, the second cavity 611 may be formed through a laser process. Also, when the first insulating layer 610 of the second circuit board 600 includes a PID, the second cavity 611 may be formed through a photolithography process.

Accordingly, the embodiment allows cavities that vertically overlap each other to be formed in each substrate in the structure of a semiconductor package in which different substrates are connected to each other. In addition, chips mounted on the semiconductor package may be respectively disposed in cavities formed in the different substrates. For example, a part of the chip may be disposed in a first cavity formed in the first circuit board, and the remaining part of the chip may be disposed in a second cavity formed in the second circuit board. Accordingly, an embodiment may reduce the overall thickness of the semiconductor package.

FIG. 13 is a view illustrating a third semiconductor package according to an embodiment.

Referring to FIG. 13, a third semiconductor package has a structure in which a memory substrate is additionally coupled to a second semiconductor package.

For example, a memory substrate includes an insulating layer 710 and circuit pattern layers 720 and 730.

In addition, a memory chip 740 may be attached onto the insulating layer 710 of the memory substrate. In this case, an adhesive layer (not shown) may be additionally disposed between the insulating layer 710 and the memory chip 740.

Meanwhile, the memory substrate may include a connection member 750 electrically connecting the circuit pattern layers 720 and 730 to a terminal 745 of the memory chip 740. The connection member 750 may be a wire, but is not limited thereto.

FIG. 14 is a view illustrating a fourth semiconductor package according to an embodiment.

Referring to FIG. 14, the fourth semiconductor package may have a structure in which a memory substrate is directly coupled to the first semiconductor package of FIG. 11. For example, in the embodiment, a pad standard in the memory substrate is made to correspond to a pad standard of the first circuit board, and thus a memory substrate, which is a second circuit board, may be directly coupled to the first circuit board.

To this end, the memory substrate may include a plurality of insulating layers. The memory substrate may include a first insulating layer 810 and a second insulating layer 820.

In addition, the memory substrate may include circuit pattern layers 830, 840, and 850 disposed on surfaces of the first insulating layer 810 and the second insulating layer 820. The circuit pattern layers 830, 840, and 850 of the memory substrate may connect between the chip 520 mounted on the first circuit board and the memory chip mounted on the memory substrate.

Meanwhile, the memory substrate may include a second cavity. In this case, the second cavity of the memory substrate may vertically overlap the cavity 121 of the first circuit board. For example, the second cavity of the memory substrate may be formed to pass through the first insulating layer 810 of the memory substrate facing the first circuit board.

In this case, at least a portion of the chip 520 mounted on the first circuit board in the embodiment may be disposed in the second cavity of the memory substrate. Accordingly, an embodiment may reduce the height of the second conductive coupling part 530 based on the depth of the second cavity, thereby reducing the overall thickness of the fourth semiconductor package.

Meanwhile, the first insulating layer 810 of the memory substrate may include a prepreg, and differently, may include a PID of a photosensitive material. And, when the first insulating layer 810 of the memory substrate includes a prepreg, the second cavity may be formed through a laser process.

In addition, when the first insulating layer 810 of the memory substrate contains a PID, the second cavity may be formed through a photolithography process.

FIGS. 15A to 15J are view showing a method of manufacturing a circuit board shown in FIG. 2 in order of processes.

Referring to FIG. 15A, an embodiment may prepare a base material for manufacturing a circuit board. For example, an embodiment may prepare a carrier board.

The carrier board may include a carrier insulating layer CB1 and a carrier metal layer CB2 disposed on at least one surface of the carrier insulating layer CB1. The carrier metal layer CB2 may be formed by electroless plating on a surface of the carrier insulating layer CB1.

Alternatively, the carrier board may be a copper clad laminate (CCL).

Next, as shown in FIG. 15B, an embodiment may proceed with a process of applying a dry film DF1 on a lower surface of the carrier metal layer CB2. In addition, the embodiment may proceed with a process of forming at least one opening in the dry film DF1. For example, the embodiment may proceed with a process of forming an opening in the dry film DF1 to correspond to a region vertically overlapping the region in which the first circuit pattern layer 130 is to be formed on the lower surface of the carrier metal layer CB2.

Thereafter, the embodiment may proceed with a process of forming a first circuit pattern layer 130 in the opening of the dry film DF1. In an embodiment, electroplating may be performed using the carrier metal layer CB2 as a seed layer to form a first circuit pattern layer 130 filling the inside of the opening of the dry film DF1.

Next, as shown in FIG. 15C, the embodiment may perform a process of forming a first insulating layer 110 on the lower surface of the carrier metal layer CB2 and the lower surface of the first circuit pattern layer 130. In this case, in an embodiment, the first insulating layer 110 may be a prepreg. Next, the embodiment may proceed with a process of forming a through hole VH1 in the first insulating layer 110. For example, the embodiment may proceed with a process of laser-processing the first insulating layer 110 to form a first through hole VH1 vertically overlapping a region in which the first through electrode V1 is to be disposed.

Next, as shown in FIG. 15D, the embodiment may proceed with a process of forming a first through electrode V1 by filling the inside of the first through hole VH1 with a conductive material, and forming a third circuit pattern layer 150 on the lower surface of the first insulating layer 110.

Next, as shown in FIG. 15E, the embodiment may proceed with a process of removing the carrier board. To this end, the embodiment may proceed with a process of separating the carrier insulating layer CB1 from the carrier metal layer CB2.

Next, the embodiment may proceed with a process of etching the carrier metal layer CB2.

Next, as illustrated in FIG. 15F, the embodiment may proceed with a process of stacking the second insulating layer 120 on the upper surface of the first insulating layer 110 and the upper surface of the first circuit pattern layer 130. The second insulating layer 120 may include a photo-sensitive material.

Next, as shown in FIG. 15G, embodiment may proceed with a process of exposing and curing the second insulating layer 120.

Specifically, the embodiment may proceed with a process of exposing the remaining regions of the second insulating layer 120 except for the region NE1 in which the second through electrode V2 is to be disposed and the region NE2 in which the cavity 121 is to be formed.

Next, as shown in FIG. 15H, the embodiment may proceed with a process of forming a second through hole VH2 and a cavity 121 by developing regions NE1 and NE2 that have not been exposed and cured. The developing process may be a process of removing the unexposed region using an organic alkaline compound containing tetramethylammonium hydroxide (TMAH) or trimethyl-2-hydroxyammonium hydroxide (choline).

Accordingly, in an embodiment, the second through hole VH2 and the cavity 121 may be formed in the second insulating layer 120.

Next, as shown in FIG. 15I, the embodiment may proceed with a process of forming a second through electrode V2 by filling the inside of the second through hole VH2 with a conductive material and forming a second circuit pattern layer 140 on the upper surface of the second insulating layer 120.

Next, as shown in FIG. 15J, the embodiment may proceed with a process of forming a first protective layer 160 on the lower surface of the first insulating layer 110 and forming a second protective layer 170 on the upper surface of the second insulating layer 120.

On the other hand, when the circuit board having the above-described characteristics of the invention is used in an IT device or home appliance such as a smart phone, a server computer, a TV, and the like, functions such as signal transmission or power supply can be stably performed. For example, when the circuit board having the features of the present invention performs a semiconductor package function, it can function to safely protect the semiconductor chip from external moisture or contaminants, or alternatively, it is possible to solve problems of leakage current, electrical short circuit between terminals, and electrical opening of terminals supplied to the semiconductor chip. In addition, when the function of signal transmission is in charge, it is possible to solve the noise problem. Through this, the circuit board having the above-described characteristics of the invention can maintain the stable function of the IT device or home appliance, so that the entire product and the circuit board to which the present invention is applied can achieve functional unity or technical interlocking with each other.

When the circuit board having the characteristics of the invention described above is used in a transport device such as a vehicle, it is possible to solve the problem of distortion of a signal transmitted to the transport device, or alternatively, the safety of the transport device can be further improved by safely protecting the semiconductor chip that controls the transport device from the outside and solving the problem of leakage current or electrical short between terminals or the electrical opening of the terminal supplied to the semiconductor chip. Accordingly, the transportation device and the circuit board to which the present invention is applied can achieve functional integrity or technical interlocking with each other. Furthermore, when the circuit board having the above-described characteristics of the invention is used in a transportation device such as a vehicle, it is possible to transmit a high-current signal required by the vehicle at a high speed, thereby improving the safety of the transportation device. Furthermore, the circuit board and the semiconductor package including the same can be operated normally even in an unexpected situation occurring in various driving environments of the transportation device, thereby safely protecting the driver.

Features, structures, effects, etc. described in the above embodiments are included in at least one embodiment, and it is not necessarily limited to only one embodiment. Furthermore, features, structures, effects, etc. illustrated in each embodiment can be combined or modified for other embodiments by those of ordinary skill in the art to which the embodiments belong. Accordingly, the contents related to such combinations and variations should be interpreted as being included in the scope of the embodiments.

In the above, the embodiment has been mainly described, but this is only an example and does not limit the embodiment, and those of ordinary skill in the art to which the embodiment pertains will appreciate that various modifications and applications not illustrated above are possible without departing from the essential characteristics of the present embodiment. For example, each component specifically shown in the embodiment can be implemented by modification. And the differences related to these modifications and applications should be interpreted as being included in the scope of the embodiments set forth in the appended claims.

The invention claimed is:

1. A circuit board comprising: a first insulating layer; a second insulating layer disposed on a first circuit pattern layer and having a first cavity; and the first circuit pattern layer disposed between the first insulating layer and the second insulating layer, wherein the first circuit pattern layer includes: a first pad part overlapping the first cavity along a vertical direction; a second pad part that does not overlap the first cavity along the vertical direction; and a connection pattern part disposed between the first pad part and the second pad part, wherein the connection pattern part includes a first portion disposed inside the first cavity and connected to the first pad part, and a second portion disposed outside the first cavity and connected to the second pad part, and wherein the connection pattern part includes a plurality of connection patterns extending along a direction from the inside of the first cavity to the outside of the first cavity and spaced apart from each other along a horizontal direction.

2. The circuit board of claim 1, wherein an upper surface of the first portion of the connection pattern part does not contact the second insulating layer while overlapping the first cavity in the vertical direction, and wherein an upper surface of the second portion of the connection pattern part contacts the second insulating layer without overlapping the first cavity in the vertical direction.

3. The circuit board of claim 1, wherein the connection pattern part, the first pad part, and the second pad part overlap each other in the horizontal direction.

4. The circuit board of claim 3, wherein a width of the connection pattern part is smaller than a width of each of the first and second pad parts.

5. The circuit board of claim 3, wherein the connection pattern part has a first planar shape, and wherein each of the first pad part and the second pad part has a second planar shape different from the first planar shape.

6. The circuit board of claim 1, wherein the second insulating layer includes a first inclined surface of the first cavity whose width decreases toward the first insulating layer, wherein the first inclined surface includes a first end portion positioned adjacent to an upper surface of the second insulating layer at one side of the first cavity, and a second end portion positioned adjacent to a lower surface of the second insulating layer at the one side of the first cavity, and wherein a horizontal distance between the first end portion and the second end portion satisfies a range of 0.1 μm to 25 μm.

7. The circuit board of claim 6, further comprising:

a protective layer disposed on the second insulating layer and including a through hole overlapping the first cavity in the vertical direction.

8. The circuit board of claim 7, wherein a width of the through hole of the protective layer is greater than a width of a region adjacent to an upper surface of the second insulating layer among an entire region of the first cavity.

9. The circuit board of claim 8, wherein the second insulating layer includes a first upper surface adjacent to the first end portion of the first inclined surface and vertically overlapping the through hole of the protective layer, and wherein a width of the first upper surface is a horizontal distance between the first end portion and an inner wall of the through hole of the protective layer adjacent to the first end portion, and satisfies a range of 50 μm to 80 μm.

10. The circuit board of claim 7, further comprising:

a second circuit pattern layer disposed on the second insulating layer, and wherein a pattern of the second circuit pattern layer disposed closest to the first end portion is spaced apart from an inner wall of the through hole of the protective layer by a spacing in a range of 55 μm to 95 μm.

11. The circuit board of claim 1, further comprising:

a first through electrode disposed in the second insulating layer, wherein the first through electrode includes an inclined surface whose width gradually narrows in a direction from an upper surface of the first through electrode to a lower surface of the first through electrode, and wherein the inclination surface of the first through electrode overlaps the first cavity along the horizontal direction.

12. The circuit board of claim 11, further comprising:

a second through electrode disposed in the second insulating layer, wherein the second through electrode has an inclined surface having an inclination different from that of the first through electrode.

13. The circuit board of claim 12, wherein the second through electrode includes an inclined surface whose width gradually narrows in a direction from an upper surface of the second through electrode to a lower surface of the second through electrode.

14. The circuit board of claim 12, wherein the inclined surface of the first through electrode and the inclined surface of the second through electrode are inclined in opposite directions.

15. The circuit board of claim 1, wherein the first circuit pattern layer is embedded in an upper surface of the first insulating layer.

16. The circuit board of claim 6, wherein the second insulating layer includes a second cavity spaced apart from the first cavity in the horizontal direction and having a second inclined surface whose width decreases toward the first insulating layer, wherein the second inclined surface includes a third end portion adjacent to an upper surface of the second insulating layer and the first end portion of the first inclined surface, and wherein a spacing between the first end portion and the third end portion satisfies a range of 100μm to 150 μm.

17. The circuit board of claim 1, further comprising:

an electronic device disposed in the first cavity.

18. The circuit board of claim 17, further comprising:

a burying insulating layer disposed in the first cavity and burying the electronic device.

* * * * *